United States Patent [19]
Kishishita et al.

[11] Patent Number: 5,423,930
[45] Date of Patent: Jun. 13, 1995

[54] METHOD OF PROVIDING A SINTERED CERAMIC BODY HAVING A CONCAVE PORTION

[75] Inventors: Hiroyuki Kishishita; Yukio Hatanaka; Yukinori Ueda, all of Kyoto, Japan

[73] Assignee: Murata Manufacturing Co., Ltd., Japan

[21] Appl. No.: 218,969

[22] Filed: Mar. 25, 1994

Related U.S. Application Data

[62] Division of Ser. No. 47,716, Apr. 14, 1993.

[30] Foreign Application Priority Data

Apr. 16, 1992 [JP] Japan .................. 4-096681
Apr. 16, 1992 [JP] Japan .................. 4-096682
Jun. 16, 1992 [JP] Japan .................. 4-156735

[51] Int. Cl.$^6$ ................... B32B 31/18; B28B 11/08
[52] U.S. Cl. ........................... 156/77; 156/89; 264/59; 264/67
[58] Field of Search ............. 264/59, 67; 156/89, 156/77, 155

[56] References Cited

U.S. PATENT DOCUMENTS 4,806,295  2/1989  Trickett et al. ................ 264/59

*Primary Examiner*—Christopher A. Fiorilla
*Attorney, Agent, or Firm*—Ostrolenk, Faber, Gerb & Soffen

[57] ABSTRACT

A method of manufacturing an electronic component having a concave portion. A ceramic laminate is prepared having a plurality of sheets with burnaway film formed thereon. The burnaway film material is capable of being burned away by firing. The burnaway film is provided in layers in positions corresponding to the desired position of the concave portion. Firing the ceramic laminate burns out the burnaway film, and a sintered body is formed with a plurality of cavities provided in layers between a plurality of thin laminate layers. Crushing the thin layers of the sintered body forms the concave portion.

4 Claims, 26 Drawing Sheets

METHOD OF PROVIDING A SINTERED CERAMIC BODY HAVING A CONCAVE PORTION

This is a division of application Ser. No. 08/047,716, filed Apr. 14, 1993.

BACKGROUND OF THE INVENTION

1. Field of the Invention

The present invention relates to a method of manufacturing an electronic component using a ceramic laminate. The present invention also relates to the structure of a variable capacitor.

2. Description of the Background Art

For example, a variable capacitor which is applied to a trimmer capacitor typically comprises a stator electrode, a rotor electrode which is rotated with respect to the same, and a dielectric which is arranged between the stator electrode and the rotor electrode. The dielectric is provided by a ceramic dielectric, for example.

In order to widen the range of capacitance adjustment in such a variable capacitor, it is necessary to increase the maximum acquirable capacitance. To this end, the dielectric which is arranged between the stator electrode and the rotor electrode is reduced in thickness. When the dielectric is formed of a ceramic dielectric, however, its thickness cannot be much reduced since the same has relatively low mechanical strength.

In order to solve this problem, either the stator electrode or the rotor electrode is formed in the interior of the ceramic dielectric. Thus, the ceramic dielectric is increased in thickness to be improved in mechanical strength, while the stator electrode and the rotor electrode are opposed to each other through a part of the ceramic dielectric so that the distance therebetween is reduced, thereby attaining a high maximum capacitance.

In relation to a variable capacitor of the aforementioned type comprising a stator electrode or a rotor electrode which is formed in the interior of a ceramic dielectric, Japanese Utility Model Publication No. 63-5223 (1988), for example, describes a variable capacitor having a stator electrode which is formed in the interior of a ceramic dielectric, in particular. In this variable capacitor, the ceramic dielectric having the stator electrode provided therein forms a stator, which is one of the basic elements of the variable capacitor, while a terminal is formed on the surface of this stator by a conductor film to be electrically connected to the stator electrode.

Further, a concave portion is formed in the lower surface of the stator which is formed by the ceramic dielectric, so that an engaging member provided on a cover for rotatably storing a rotor forming the rotor electrode engages on this concave portion. Therefore, the engaging member will not project beyond the lower surface of the stator, whereby the variable capacitor can be surface-mounted on a printed circuit board with no problem.

It is basically possible to manufacture the aforementioned stator, which is formed by a ceramic dielectric having a stator electrode provided therein, by a technique of manufacturing a multilayer ceramic capacitor. However, the technique of manufacturing a multilayer ceramic capacitor cannot be simply employed due to the presence of the concave portion, which is not necessary for a multilayer ceramic capacitor. While the aforementioned literature describes no method for obtaining such a stator, a ceramic dielectric for forming a stator may be provided with a shape for defining a concave portion in a stage before firing, to be then fired. In this method, however, it is anticipated that a specific step is required for forming the concave portion with requirement for a specific die or equipment, leading to increase in cost for the stator.

While a problem of the conventional manufacturing method has been described with reference to a variable capacitor, such a problem is not specific to the variable capacitor but may also arise in manufacturing of an electronic component using a ceramic laminate provided with a concave portion, such as a feed-through capacitor, a capacitor network, a high-voltage capacitor or a semiconductor package. This problem is particularly serious if the concave portion has a complicated shape.

Accordingly, an object of the present invention is to provide an improved method of manufacturing an electronic component using a ceramic laminate such as a variable capacitor, for example, which is adapted to enable manufacturing of a ceramic laminate, particularly that provided with a concave portion, by a method substantially similar to that for manufacturing a general multilayer ceramic capacitor.

In the variable capacitor described in the aforementioned literature, further, the stator electrode is formed by two semicircular split electrodes, while the rotor electrode is also formed by two semicircular split electrodes. The stator formed by the ceramic dielectric having the stator electrode therein is provided with two terminal electrodes, for serving as terminals, which are electrically connected to the two split electrodes forming the stator electrode respectively.

According to this variable capacitor, therefore, the two split electrodes forming the stator electrode and the those forming the rotor electrode form four electrostatic capacitances in total. Among these electrostatic capacitances, the first and second capacitances form a series circuit while the third and fourth capacitances form another series circuit, so that such two series circuits are connected in parallel with each other.

However, the variable capacitor of the aforementioned structure has the following problems to be solved:

First, the maximum capacitance cannot be appreciably increased. Since the stator electrode and the rotor electrode are formed by split electrodes respectively so that pairs of the as-formed four capacitances are connected in series to each other respectively, the maximum capacitance is merely implemented by an electrostatic capacitance which is attained when quarter-circular electrodes are opposed to each other. Such a maximum capacitance is merely half that of a usual variable capacitor, which is implemented by an electrostatic capacitance attained when semicircular electrodes are opposed to each other.

Further, the capacitance is increased from the minimum to the maximum upon 90° rotation of the rotor, since the stator electrode and the rotor electrode are formed by split electrodes respectively. In a usual variable capacitor, on the other hand, the capacitance is increased from the minimum to the maximum upon 180° rotation of a rotor. Therefore, the aforementioned variable capacitor has small resolution in capacitance adjustment, and the capacitance is relatively hard to adjust.

Further, the rotor forming the rotor electrode, which is formed by split electrodes, must be made of an insulating material such as ceramic or resin. In a usual variable capacitor, on the other hand, such a rotor is made of a metal to integrally form a rotor electrode. In the aforementioned variable capacitor, therefore, a working step for obtaining such a rotor is complicated as compared with the usual one.

In addition, the cover for rotatably storing the rotor is provided with no spring for pressing the rotor against the stator. Therefore, dimensional dispersion of the cover, the rotor and the stator appears as dispersion in force for pressing the rotor against the stator, and hence the torque of the rotor and the capacitance may be instabilized.

Accordingly, another object of the present invention is to solve the aforementioned problems in a variable capacitor comprising a stator which is formed by a ceramic dielectric having a stator electrode provided therein.

SUMMARY OF THE INVENTION

A variable capacitor according to the present invention comprises a stator of a ceramic dielectric, which has a stator electrode provided in its interior, a terminal provided at least on its side surface to be electrically connected with the stator electrode, and a concave portion formed in an edge of its lower surface toward the interior. A rotor is arranged on the upper surface of this stator. The rotor, which is made of a metal, has a rotor electrode provided on its lower surface to be opposite to the stator electrode, and a driver groove provided in its upper surface. The rotor is rotatably stored in a cover of a metal which is in contact therewith. This cover has an opening, which is covered with the stator, in its lower surface, and an adjusting hole provided in its upper surface for exposing the driver groove. A spring action part is provided on a peripheral edge portion of the adjusting hole for pressing the rotor against the stator. In order to maintain the opening, which is provided in the lower surface of the cover, in a state being covered with the stator, an engaging member is provided on this cover to engage in the concave portion formed in the lower surface of the stator.

The aforementioned spring action part may be provided by a metal material defining the peripheral edge portion of the adjusting hole of the cover, a spring washer which is prepared independently of the cover, or both of such elements. The spring washer is arranged between the peripheral edge portion of the adjusting hole of the cover and the rotor.

An O-ring may be arranged between the rotor and the stator.

As hereinafter described, the concave portion of the stator is preferably obtained by forming a plurality of thin layers in the ceramic dielectric obtained by firing through cavities and crushing the thin layers.

According to the present invention, an adjustable electrostatic capacitance is formed between a stator electrode and a rotor electrode which are opposed to each other through a part of the stator of a ceramic dielectric. This electrostatic capacitance is extracted by the terminal which is formed on the side surface of the stator to be electrically connected with the stator electrode, and the cover of a metal which is in contact with the rotor.

Thus, according to the present invention, an effective opposite area of the stator electrode and the rotor electrode providing the maximum capacitance is about half the area of the lower surface of the rotor, whereby such an area can be doubled as compared with the variable capacitor described in the aforementioned literature in relation to rotors of the same dimensions. Further, the inventive variable capacitor can be reduced in size as compared with the variable capacitor described in the literature, when the former is adapted to acquire a maximum capacitance which is equivalent to that of the latter.

Further, the capacitance is increased from the minimum to the maximum upon 180° rotation of the rotor, whereby resolution in capacitance adjustment is doubled as compared with the variable capacitor described in the aforementioned literature, and the capacitance is easy to adjust.

Due to the spring action part provided on the cover, the force for pressing the rotor against the stator is stabilized. Therefore, the torque of the rotor and the electric capacitance as acquired are stabilized.

Further, the rotor is made of a metal so that the rotor electrode can be integrally formed with the rotor, no complicated working is required for obtaining the rotor and hence the inventive variable capacitor is excellent in mass productivity.

When an O-ring is arranged between the rotor and the stator, it is possible to obtain a variable capacitor having a closed structure. Thus, it is possible to prevent infiltration of solder, flux, washing solution and the like, whereby the variable capacitor can be mounted by solder dipping on a printed circuit board, for example, similarly to other electronic components.

When the concave portion of the stator is obtained by forming a plurality of thin layers in the ceramic dielectric prepared by firing through cavities and crushing the thin layers, it is possible to efficiently form the concave portion.

The aforementioned method for forming a concave portion in the stator can also be applied to a method of manufacturing an electronic component using a ceramic laminate provided with a concave portion. Thus, the present invention is also directed to a method of manufacturing an electronic component using a ceramic laminate provided with a concave portion. The inventive method comprises the following steps: In a first step, prepared is a ceramic laminate having a plurality of burnaway films, made of a material which can be burned away by firing, provided in the form of layers in a position corresponding to that of the concave portion. In a second step, the ceramic laminate is fired to burn out the burnaway films, thereby obtaining a sintered body which is provided with a plurality of cavities in the form of layers and a plurality of thin layers formed through the plurality of cavities. In a third step, the thin layers of the sintered body are crushed, to form the concave portion as the result.

According to the present invention, the ceramic laminate can be obtained in a method which is substantially similar to that for a ceramic laminate prepared for manufacturing a general multilayer ceramic capacitor. Namely, the burnaway films can be formed by printing or the like, similarly to internal electrodes formed in a multilayer ceramic capacitor. Further, a pressing step for obtaining a dense laminate structure of the ceramic laminate can also be applied similarly to that for a multilayer ceramic capacitor.

Further, the ceramic laminate can be fired in a similar manner to that applied to a multilayer ceramic capacitor, in order to obtain a sintered body.

As to a method of forming the concave portion by crushing the thin layers, it is possible to directly apply a crushing method such as barrel polishing or blasting, for example, which is applied to manufacturing of a multilayer ceramic capacitor.

Thus, according to the present invention, it is possible to manufacture an electronic component using a ceramic laminate which is provided with a concave portion through an already established technique of manufacturing a general multilayer ceramic capacitor. Therefore, the present invention requires neither a specific step nor a specific die or equipment for forming the concave portion, whereby such an electronic component can be provided at a low cost.

Even if a section of the concave portion provided in the ceramic laminate has a curved shape which is hard to obtain by punching, for example, it is possible to extremely easily form such a concave portion according to the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
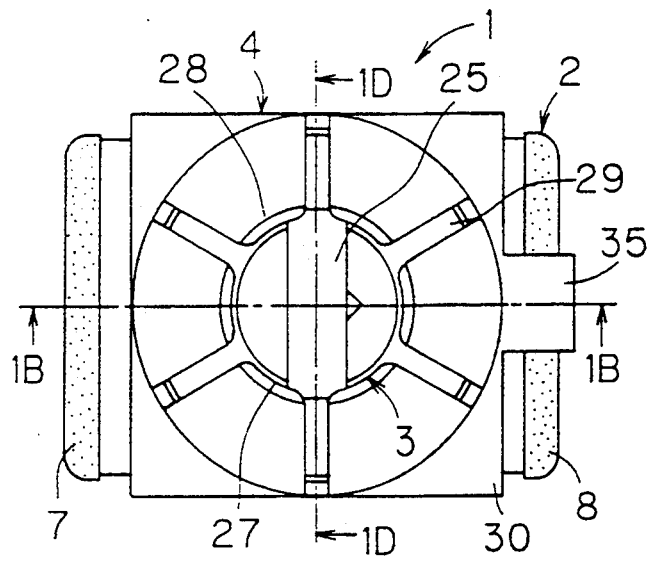
FIG. 1A is a plan view showing a variable capacitor 1 according to a first embodiment of the present invention.

FIGS. 1A to 8D are adapted to illustrate a first embodiment of the present invention. A variable capacitor 1 according to this embodiment is shown in FIGS. 1A to 3.

In a wide aspect, the variable capacitor 1 comprises a stator 2, a rotor 3 and a cover 4. The stator 2 is formed of a ceramic dielectric as a whole. The rotor 3 is made of a metal such as brass. The cover 4, which is made of a metal such as stainless steel or a copper alloy, may be surface-treated with solder, tin or silver at least in a necessary portion, to be improved in solderability.

Structures of the aforementioned respective elements are now described in detail.

First, the stator 2 is described with reference to FIGS. 4A to 4D. The stator 2 has a laterally symmetrical structure as a whole. Stator electrodes 5 and 6 are arranged in the stator 2. Terminals 7 and 8 defined by conductor films are provided at least on side surfaces of the stator 2, to be electrically connected with the stator electrodes 5 and 6 respectively. Concave portions 9 and 10 are formed in the lower surface of the stator 2 from edges toward the interior. According to this embodiment, slightly projecting ribs 11 and 12 are formed on the edges of the lower surface of the stator 2 provided with the concave portions 9 and 10.

The aforementioned two stator electrodes 5 and 6 are adapted to implement the laterally symmetrical structure of the stator 2 so that it is not necessary to consider the direction of the stator 2 in formation of the terminals 7 and 8 and assembling of the variable capacitor 1 with the stator 2. If such an advantage is not desired, therefore, one of the stator electrodes 5 and 6 is unnecessary and the terminal 7 or 8 connected to the unnecessary stator electrode 5 or 6 may be omitted.

Figure 5:
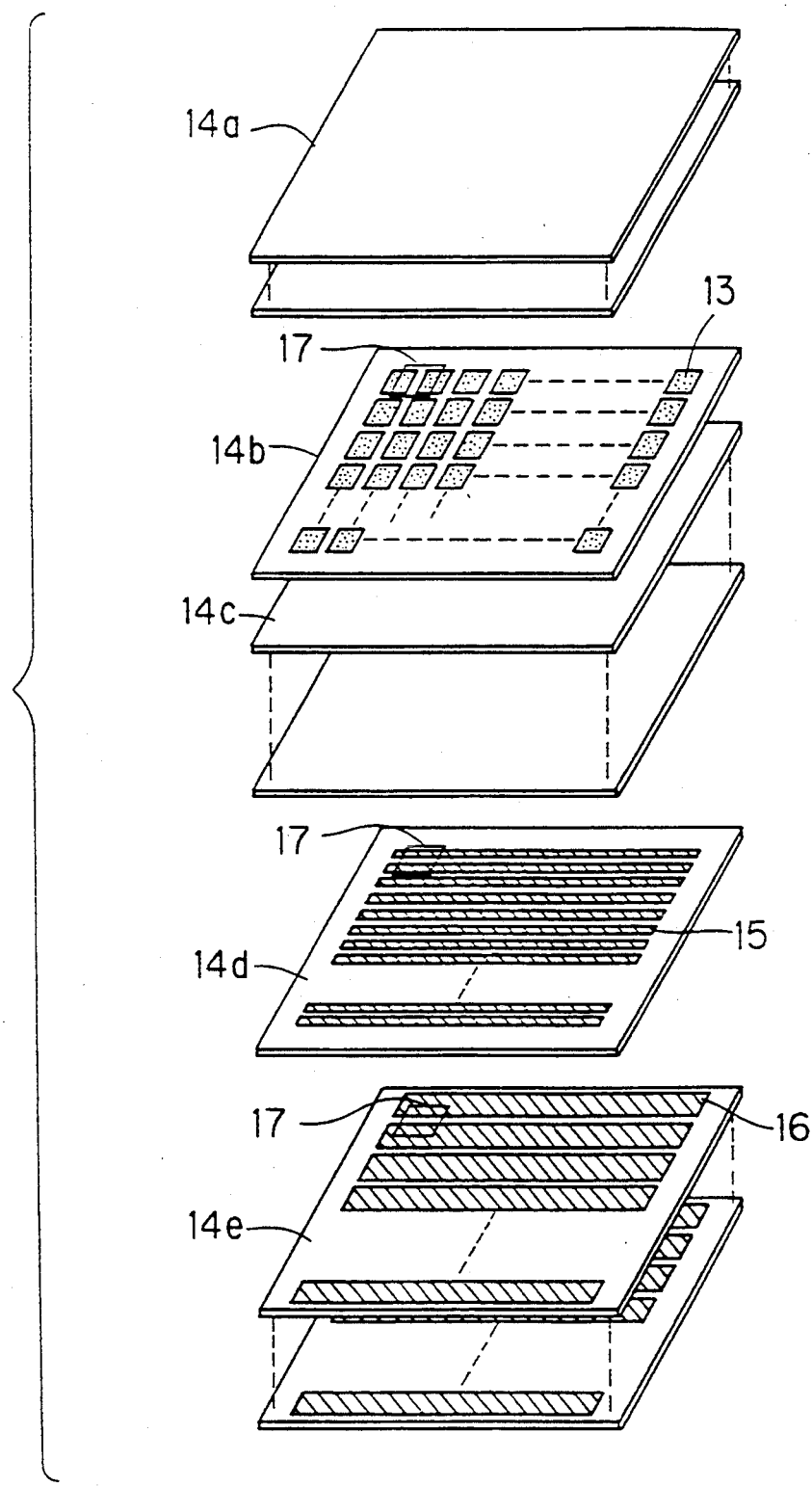
FIG. 5 is a perspective view showing sheets 14a to 14e of a ceramic dielectric prepared for obtaining the stator 2 shown in FIG. 4A.

The stator 2 thus provided with the stator electrodes 5 and 6 in its interior can be basically manufactured by a technique of manufacturing a multilayer ceramic capacitor. Due to the concave portions 9 and 10 which are not provided in a multilayer ceramic capacitor, however, the technique of manufacturing a multilayer ceramic capacitor cannot be simply employed but some alteration is necessary. For example, a ceramic dielectric for forming the stator 2 may be provided with shapes for defining the concave portions 9 and 10 in a stage before firing, so that the ceramic dielectric is then fired. More preferably, however, the following method is employed:

In order to obtain a number of stators 2 at the same time, a plurality of sheets 14a to 14e, including a sheet 14b of a ceramic dielectric provided with conductor films 13 for defining a number of stator electrodes 5 and 6, are stacked as shown in FIG. 5. Among these sheets 14a to 14e, the sheets 14a and 14c are provided with no films while the sheet 14b is provided thereon with the conductor films 13, which are formed in vertical and transverse arrangement by screen printing of Ag-Pd paste, for example. On the other hand, the sheet 14d is provided thereon with burnaway films, such as carbon films 15, for example, which are arranged in parallel with each other in the form of relatively narrow stripes by screen printing. Further, a plurality of remaining sheets 14e are provided thereon with burnaway films, such as carbon films 16, for example, which are arranged in parallel with each other in the form of relatively wide stripes by screen printing. The carbon films 15 and 16 may be replaced by resin films respectively. Further, the carbon films 15 and 16 may discontinuously extend respectively, dissimilarly to the continuously extending ones shown in FIG. 5.

Figure 6A:
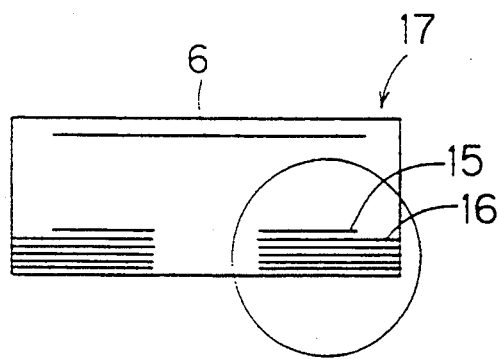
FIG. 6A is a sectional view, corresponding to a sectional view taken along the line VI—VI in FIG. 4A, showing a laminate 17 obtained by stacking the sheets 14a to 14e and cutting the same.
Figure 6B:
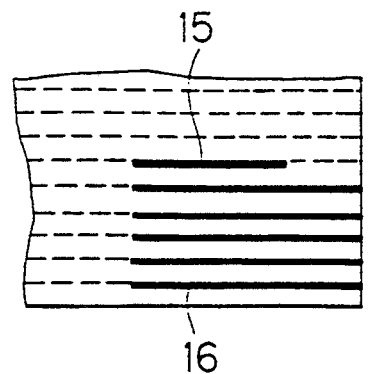
FIG. 6B is an enlarged sectional view showing the encircled portion in FIG. 6A.

The sheets 14a to 14e stacked as shown in FIG. 5 are rigid-pressed and then cut to be divided into a plurality of chips for defining individual stators 2. Referring to FIG. 5, regions for defining a single chip 17 are enclosed with quadrangles on the sheets 14b, 14d and 14e. Further, FIG. 6A shows such a single chip, i.e., a laminate 17. Each of FIGS. 6A, 6C and 6E shows a section corresponding to that taken along the line VI—VI in FIG. 4A.

As shown in FIG. 6A, each chip 17 is provided therein with carbon films 15 and plural carbon films 16, in addition to the stator electrodes 5 (not shown) and 6. FIG. 6B is an enlarged sectional view showing the encircled portion in FIG. 6A.

Figure 6C:
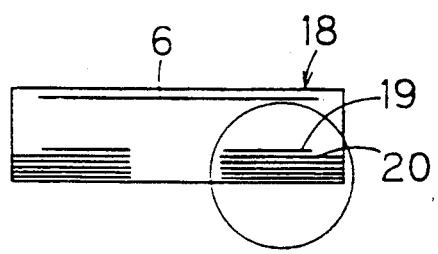
FIG. 6C is a sectional view, corresponding to FIG. 6A, showing a sintered body 18 obtained by firing the laminate 17 shown in FIG. 6A.

The chip 17 is so fired as to obtain a sintered body 18 shown in FIG. 6C. In the interior of this sintered body 18, the stator electrodes 5 and 6 remain but the carbon films 15 and 16 are burned away to define cavities 19 and plural cavities 20 in the form of layers, as clearly understood from an enlarged sectional view shown in FIG. 6D. Consequently, thin layers 21 and plural thin layers 22 are defined between the cavities 19 and 20.

Figure 6D:
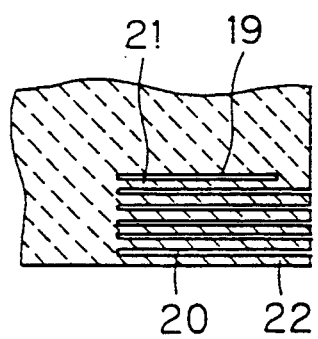
FIG. 6D is an enlarged sectional view showing the encircled portion in FIG. 6B.
Figure 6E:
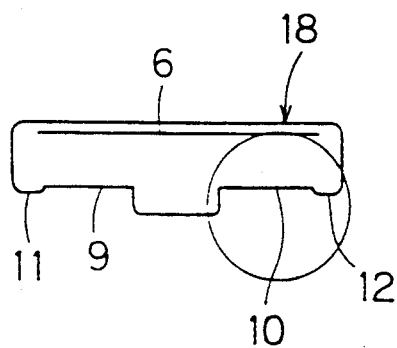
FIG. 6E is a sectional view, corresponding to FIG. 6C, showing a polished state of the sintered body 18.
Figure 6F:
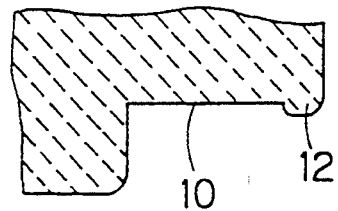
FIG. 6F is an enlarged sectional view showing the encircled portion in FIG. 6E.

Then, the sintered body 18 is subjected to a polishing step such as barrel polishing. Thus, corner portions of the sintered body 18 are chamfered and the thin layers 21 and 22 are crushed as shown in FIG. 6E. As the result, concave portions 9 and 10 are defined. Since the cavities 19 and the thin layers 21 do not reach the side surfaces of the sintered body 18 as shown in FIG. 6D, ribs 11 and 12 are defined upon crushing of the thin layers 21.

Thereafter the sintered body 18 is preferably subjected to a blasting step. Thus, it is possible to completely remove portions, which have been impossible to remove in the aforementioned barrel polishing, of the thin layers 21 and 22 remaining in corners of the concave portions 9 and 10. In the crushing step, application of a water jet or ultrasonic waves may be employed in addition to or in place of the aforementioned barrel polishing and blasting.

When the terminals 7 and 8 are formed on the as-obtained sintered body 18 by conductor films as hereinabove described, the stator 2 shown in FIGS. 4A to 4D is obtained.

Figure 7A:
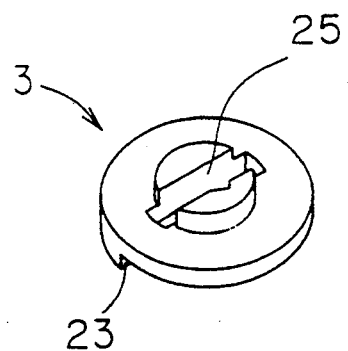
FIG. 7A is a perspective view of a rotor 3 included in the variable capacitor 1 shown in FIG. 1A as viewed from the above.
Figure 7B:
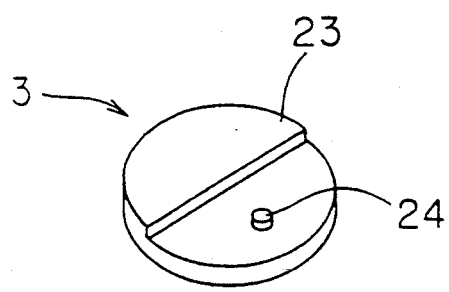
FIG. 7B is a perspective view of the rotor 3 shown in FIG. 7A as viewed from below.

FIGS. 7A and 7B independently show the rotor 3. FIG. 7A shows the upper surface of the rotor 3, while FIG. 7B shows the lower surface thereof.

The rotor 3, which is arranged on the upper surface of the aforementioned stator 2, is provided on its lower surface with a semicircular rotor electrode 23 by a projecting stepped portion. The rotor 3 is further provided on its lower surface with a convex portion 24 which is flush with the rotor electrode 23, to be prevented from inclination caused by formation of the rotor electrode 23.

On the other hand, a driver groove 25 is formed in the upper surface of the rotor 3, as shown in FIG. 7A.

FIGS. 8A to 8D independently show the cover 4. This cover 4 is so shaped as to come into contact with the aforementioned rotor 3 for rotatably storing the same. The lower surface of the cover 4 defines an opening 26 which is covered with the aforementioned stator 2, while an adjusting hole 27 is formed in the upper surface to expose the aforementioned driver groove 25.

A peripheral edge portion of the adjusting hole 27 defines a spring action part 28. According to this embodiment, a plurality of radially extending notches 29 are provided in the peripheral edge portion of the adjusting hole 27, to provide a stabler spring action in the spring action part 28. As clearly understood from FIGS. 8B and 8D, further, the spring action part 28 slightly downwardly inclines, to also contribute to a stabler spring action.

Figure 8A:
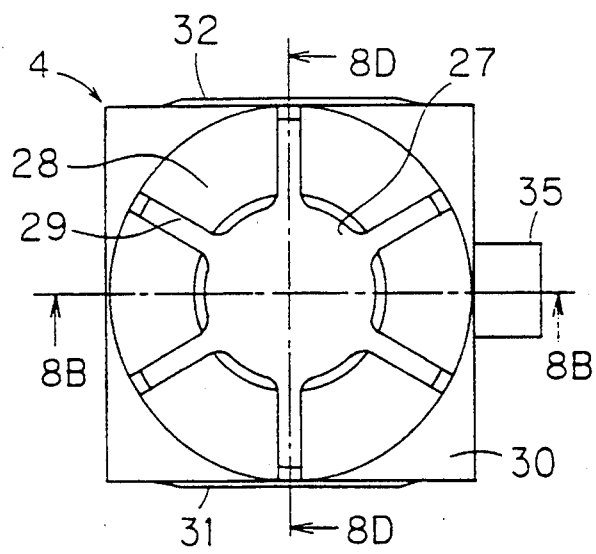
FIG. 8A is a plan view of a cover 4 included in the variable capacitor 1 shown in FIG. 1A.
Figure 8D:
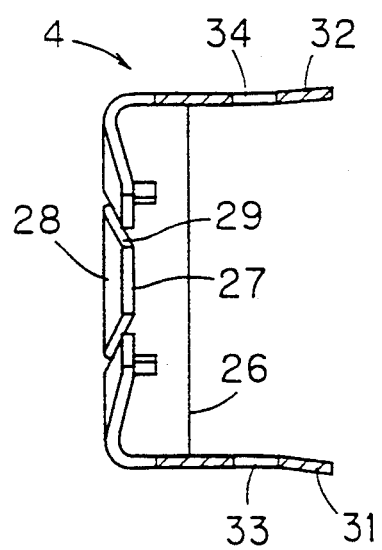
FIG. 8D is a sectional view taken along the line 8D—8D in FIG. 8A.
Figure 8B:
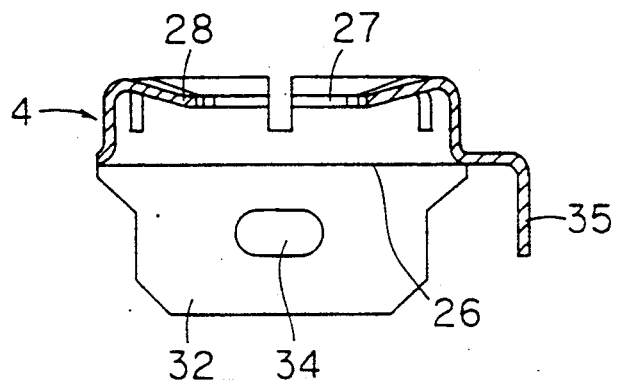
FIG. 8B is a sectional view taken along the line 8B—8B in FIG. 8A.
Figure 8C:
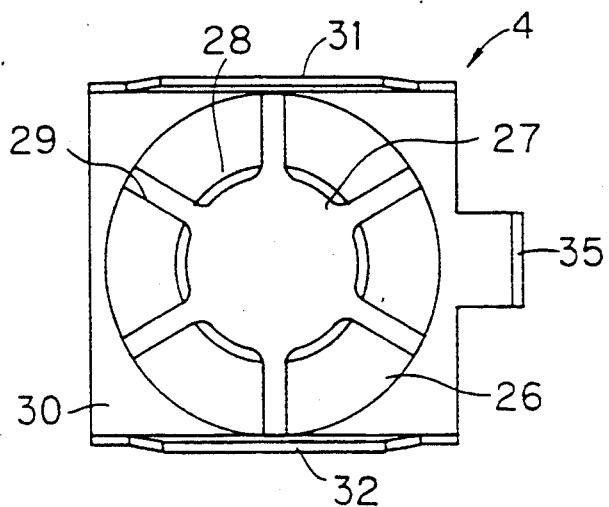
FIG. 8C is a bottom plan view of the cover 4 shown in FIG. 8A.

A quadrangular flange 30 is provided on a peripheral edge portion of the opening 26 defined in the lower surface of the cover 4, and engaging members 31 and 32 are provided to downwardly extend from opposite edges of the flange 30 respectively. These engaging members 31 and 32 are bent in a later stage to engage with the concave portions 9 and 10 provided in the lower surface of the stator 2 respectively. In order to facilitate such bending, the engaging members 31 and 32 are provided with transverse slots 33 and 34 respectively, as shown in FIGS. 8B and 8D.

A terminal 35 is provided to sidewardly and downwardly extend from an edge of the flange 30 provided with no engaging members 31 and 32.

The stator 2, the rotor 3 and the cover 4 which are independently shown in FIGS. 4A to 4D, 7A to 7B and 8A to 8D are employed to assemble the variable capacitor 1 shown in FIGS. 1A to 3.

In more concrete terms, the rotor 3 is placed on the stator 2, and the cover 4 is arranged to cover the rotor 3. Then, the cover 4 is pressed against the stator 2 to bring the rotor 3 into pressure contact with the stator 2, while respective end portions of the engaging members 31 and 32 provided on the cover 4 are inwardly bent respectively. Thus, the engaging members 31 and 32 engage with the concave portions 9 and 10 provided in the lower surface of the stator 2 respectively. Due to the ribs 11 and 12 provided on the edge portions of the lower surface of the stator 2, the engaging members 31 and 32 are strongly maintained in engagement with the stator 2.

The terminal 35 provided on the cover 4 is brought into a position opposite to the terminal 8 provided on the stator 2. When solder 36 is applied between the terminals 35 and 8, therefore, the cover 4 is more strongly fixed to the stator 2.

Thus, the variable capacitor 1 is completely assembled. In such an assembled state, the rotor 3 is pressed against the stator 2 by the spring action part 28 provided on the cover 4, so that stable adhesion is attained between the rotor 3 and the stator 2. Thus, the torque of the rotor 3 and an electrostatic capacitance formed between the stator electrode 5 and the rotor electrode 23 are stabilized.

The aforementioned electrostatic capacitance is extracted by the terminal 7 which is electrically connected with the stator electrode 5, and the terminal 35 provided on the cover 4 which is in contact with the rotor 3 forming the rotor electrode 23, or the terminal 8. The cover 4 may be provided with no such terminal 35 so that the engaging member 31 or 32 is employed as one of the terminals.

Figure 1D:
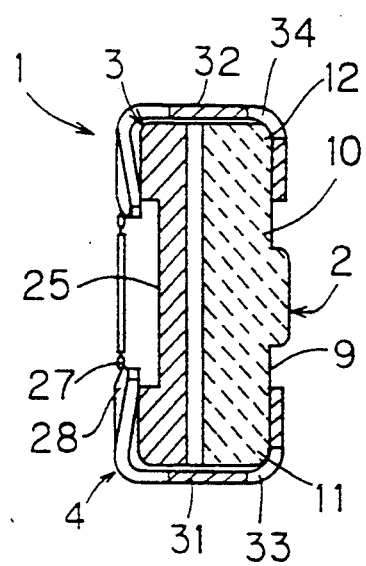
FIG. 1D is a sectional view taken along the line 1D—1D in FIG. 1A.
Figure 1B:
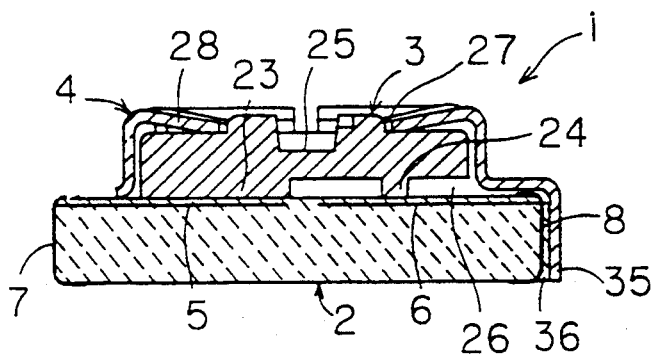
FIG. 1B is a sectional view taken along the line 1B—1B in FIG. 1A.
Figure 1C:
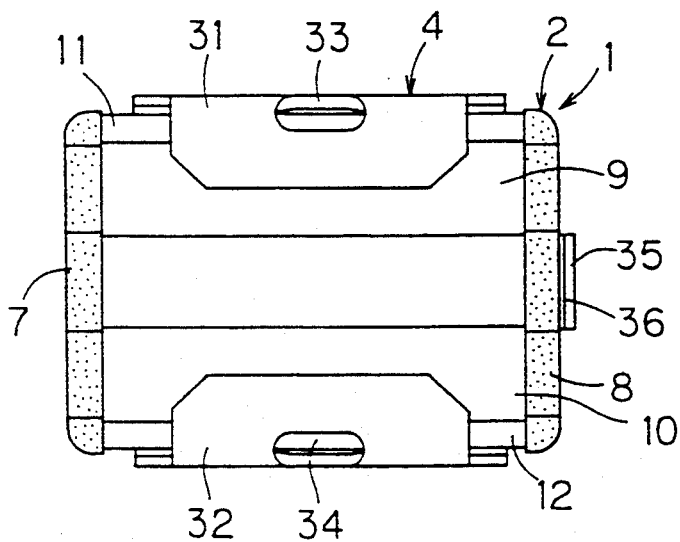
FIG. 1C is a bottom plan view of the variable capacitor 1 shown in FIG. 1A.
Figure 2:
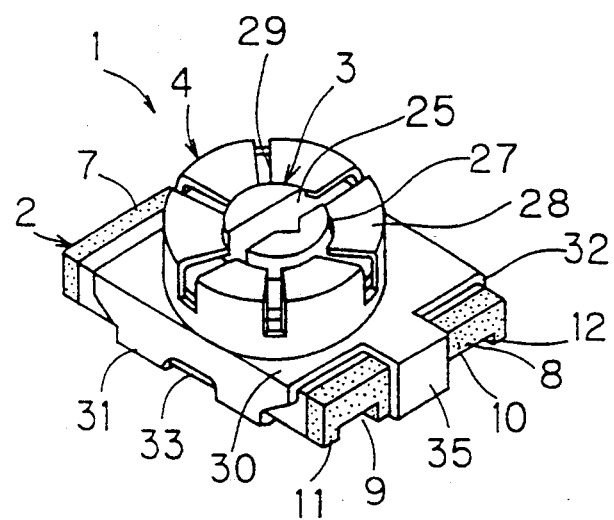
FIG. 2 is a perspective view of the variable capacitor 1 shown in FIG. 1A as viewed from above.
Figure 3:
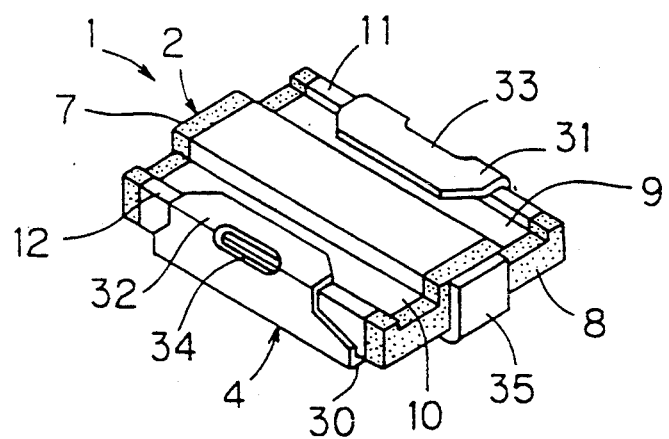
FIG. 3 is a perspective view of the variable capacitor 1 shown in FIG. 1A as viewed from below.
Figure 4A:
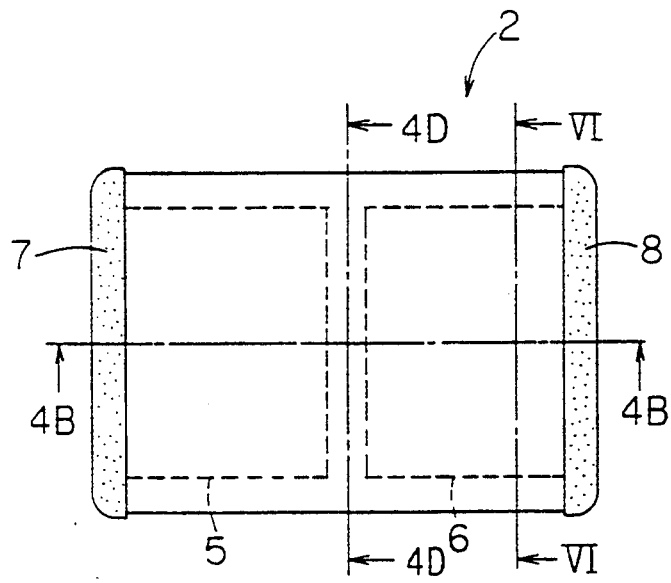
FIG. 4A is a plan view showing a stator 2 included in the variable capacitor 1 shown in FIG. 1A.
Figure 4D:
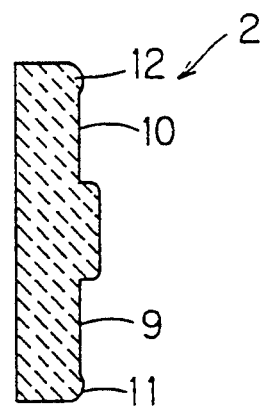
FIG. 4D is a sectional view taken along the line 4D—4D in FIG. 4A.
Figure 4B:
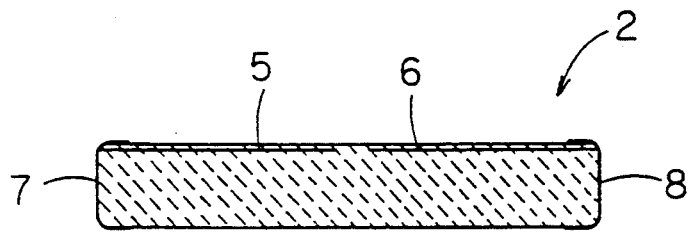
FIG. 4B is a sectional view taken along the line 4B—4B in FIG. 4A.
Figure 4C:
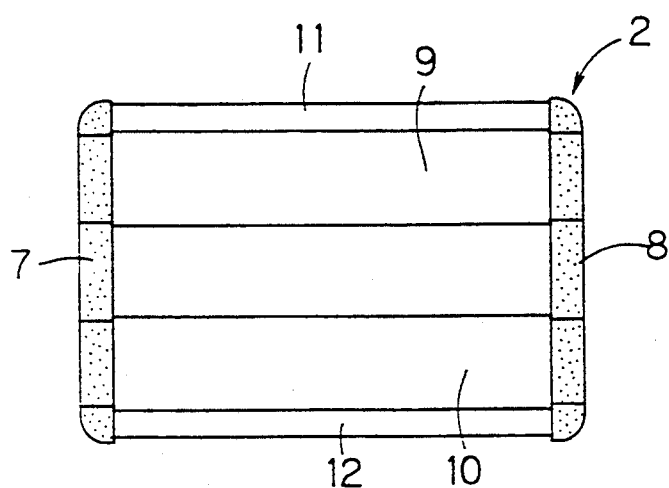
FIG. 4C is a bottom plan view of the stator 2 shown in FIG. 4A.

As clearly understood from FIG. 1D, the engaging members 31 and 32 are located in the concave portions 9 and 10 not to project from the lower surface of the stator 2, whereby the variable capacitor 1 can be mounted on a printed circuit board (not shown), for example, in a stable state. In such a mounted state, the terminals 7 and 35 or 8 are directly soldered to conductive lands provided on the printed circuit board respectively.

FIGS. 9A to 20 show some other embodiments of the variable capacitor according to the present invention. Referring to these figures, elements corresponding to those included in the aforementioned variable capacitor 1 are denoted by similar reference numerals, to omit redundant description.

A variable capacitor 1a shown in FIGS. 9A to 9D is characterized in that a spring action part is formed by a spring washer 37. According to this embodiment, the spring action part is not defined by a metal material forming a peripheral edge portion of an adjusting hole 27 of a cover 4 itself. Therefore, the peripheral edge portion of the adjusting hole 27 is subjected to no working but maintained in a flat state.

A secondary feature of the variable capacitor 1a shown in FIGS. 9A to 9D resides in that the distance between the cover 4 and a stator 2 is widened. Thus, the cover 4 is further reliably prevented from coming into undesired contact with a terminal 7. According to this embodiment, further, an insulating film 38 is formed to cover parts of the terminal 7 and another terminal 8 respectively. This further reduces a possibility of the aforementioned shorting.

According to this embodiment, further, a hole 39 is formed in a bent portion of a terminal 35 provided on the cover 4, to facilitate bending thereof. The terminal 35 is not positively connected with the terminal 8. In addition, a flange 30 provided on the cover 4 has a substantially circular shape.

Noting the lower surface of the stator 2, a concave portion 40 is formed to extend in series from one edge to another edge.

Figure 9A:
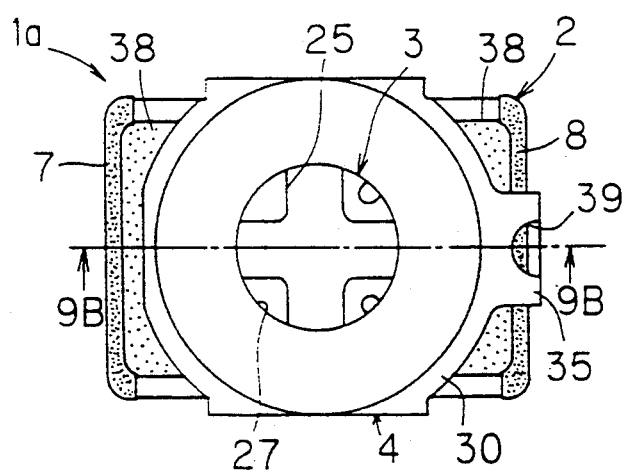
FIG. 9A is a plan view showing a variable capacitor 1a according to a second embodiment of the present invention.
Figure 9D:
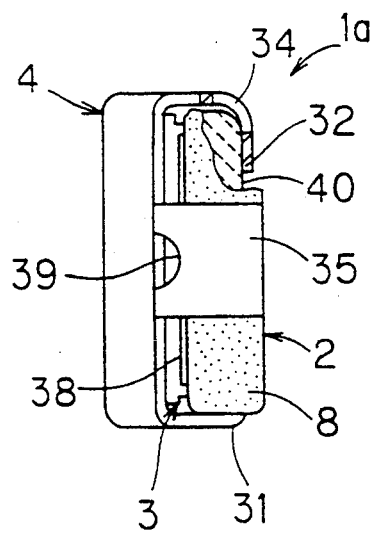
FIG. 9D is a partially fragmented right side elevational view of the variable capacitor 1a shown in FIG. 9A.
Figure 9B:
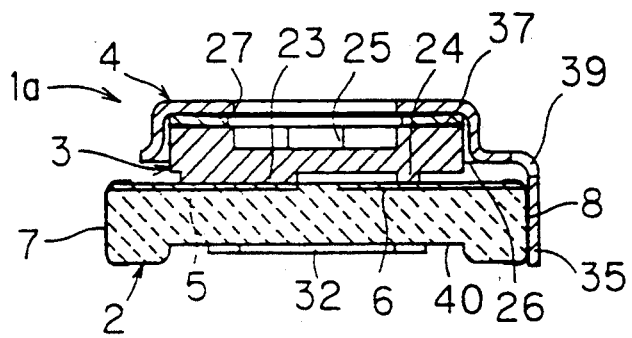
FIG. 9B is a sectional view taken along the line 9B—9B in FIG. 9A.
Figure 9C:
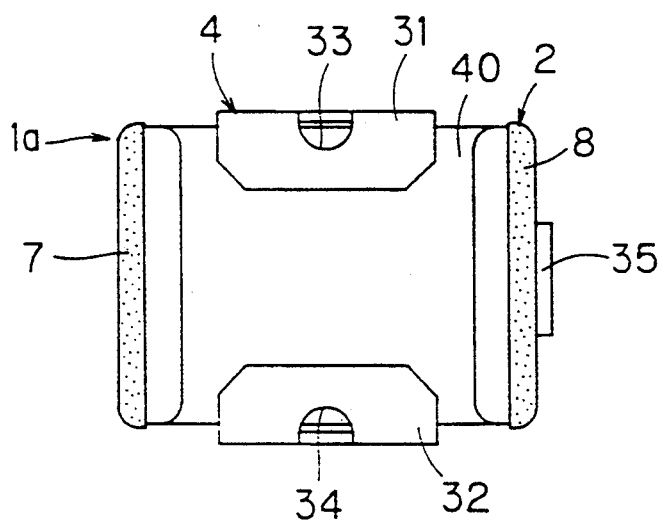
FIG. 9C is a bottom plan view of the variable capacitor 1a shown in FIG. 9A.
Figure 10:
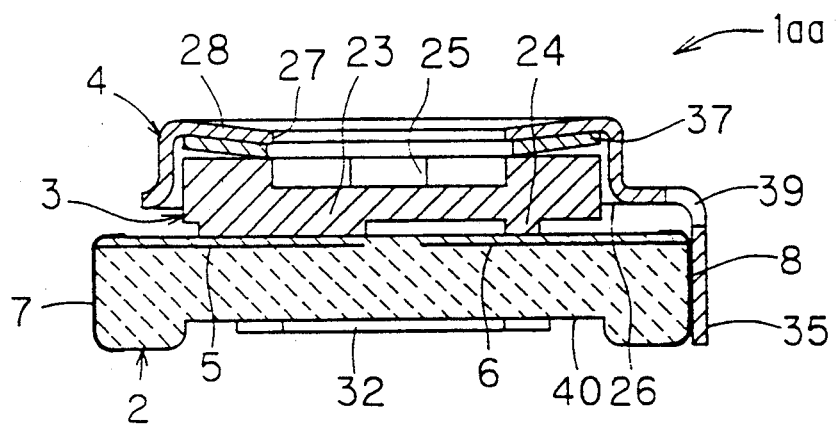
FIG. 10 is a sectional view, corresponding to FIG. 9B, showing a variable capacitor 1aa according to a third embodiment of the present invention.

FIG. 10 shows a modification of the variable capacitor 1a shown in FIGS. 9A to 9D. This figure corresponds to FIG. 9B.

A variable capacitor 1aa shown in FIG. 10 is characterized in that a spring action part is formed not only by a spring washer 37 but by a spring action part 28 which is defined by a metal material forming a peripheral edge portion of an adjusting hole 27 provided in the cover 4 itself, similarly to the variable capacitor 1 shown in FIGS. 1A to 1D. The spring washer 37 is so shaped as to downwardly incline toward the center, while the spring action part 28 is also shaped to incline toward the center.

According to such a variable capacitor 1aa, it is possible to press a rotor 3 against a stator 2 with stabler and larger force as compared with the variable capacitor 1a shown in FIGS. 9A to 9D.

Figure 11:
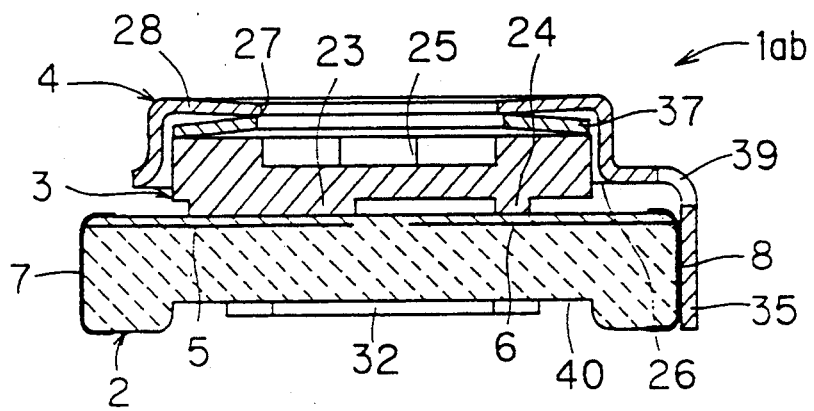
FIG. 11 is a sectional view, corresponding to FIG. 9B, showing a variable capacitor 1ab according to a fourth embodiment of the present invention.

Similarly to FIG. 10, FIG. 11 shows another modification of the variable capacitor 1a shown in FIGS. 9A to 9D, in correspondence to FIG. 9B.

Similarly to the variable capacitor 1aa shown in FIG. 10, a variable capacitor 1ab shown in FIG. 11 comprises both of a spring action part 28 which is defined by a metal material forming a peripheral edge portion of an adjusting hole 27 provided in a cover 4 itself, and a spring washer 37. According to this embodiment, the spring washer 37 is so shaped as to upwardly incline toward the center. The spring washers 37 shown in FIGS. 11 and 10 can be implemented by the same component, so that the structure shown in FIG. 11 or 10 can be attained by simply changing the direction for assembling such a component.

Also according to the variable capacitor 1ab shown in FIG. 11, it is possible to press the rotor 3 against the stator 2 with stabler and larger force.

Figure 12:
FIG. 12 is a front elevational view showing a spring washer 37a which can be employed in place of a spring washer 37 provided in each of the second to fourth embodiments of the present invention.
Figure 13A:
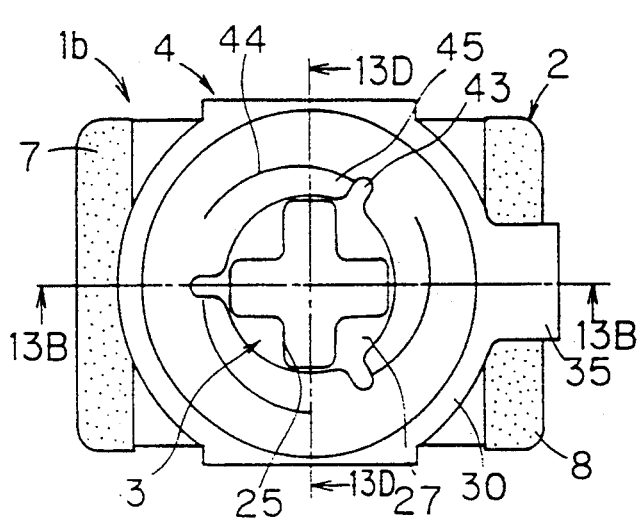
FIG. 13A is a plan view showing a variable capacitor 1b according to a fifth embodiment of the present invention.
Figure 13D:
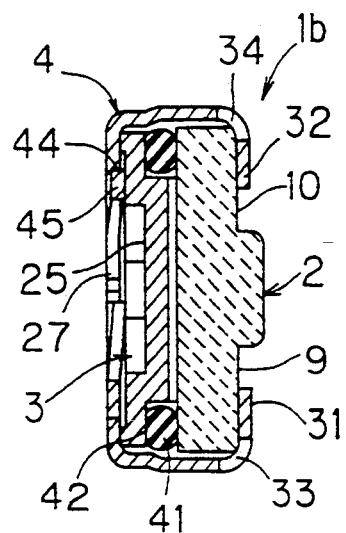
FIG. 13D is a sectional view taken along the line 13D—13D in FIG. 13A.
Figure 13B:
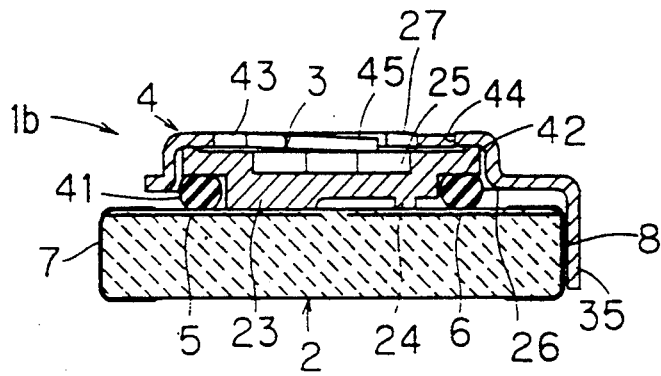
FIG. 13B is a sectional view taken along the line 13B—13B in FIG. 13A.
Figure 13C:
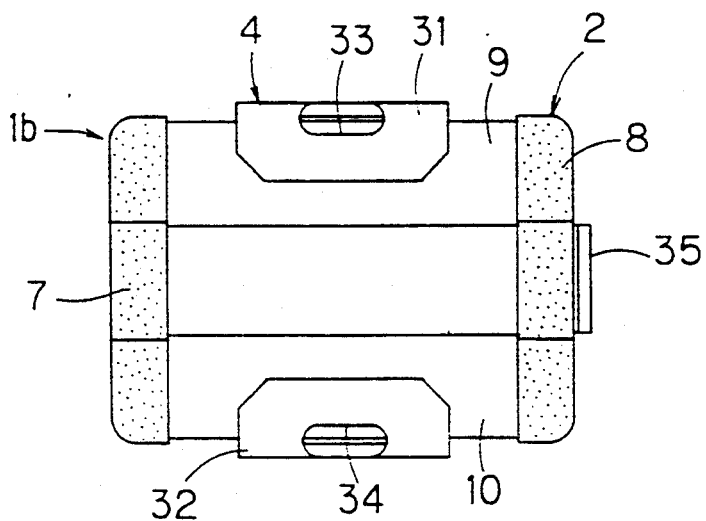
FIG. 13C is a bottom plan view of the variable capacitor 1b shown in FIG. 13A.

FIG. 12 shows a spring washer 37a, which can be employed in place of the spring washer 37 in the embodiment shown in FIGS. 9A to 9D, 10 or 11. This spring washer 37a is in the form of a ring as a whole, while the same is corrugated. When such a spring washer 37a is assembled in the variable capacitor, it is not necessary to distinguish its front side from its rear side.

A variable capacitor 1b shown in FIGS. 13A to 13D comprises an O-ring 41. This O-ring 41 is made of an elastic material such as silicone rubber, for example, which can withstand soldering heat. The O-ring 41 is arranged between a rotor 3 and a stator 2, thereby supplying a closed structure in contact portions between the rotor 3 and the stator 2. The rotor 3 is provided with a concave portion 42 for receiving the O-ring 41.

A cover 4 provided in this variable capacitor 1b is reduced in height, so that the space between the cover 4 and the stator 2 is widened. Thus, the cover 4 is prevented from coming into undesired contact with a terminal 7.

Further, a peripheral edge portion of an adjusting hole 27 formed in this cover 4 is provided with radially extending notches 43 and substantially circumferentially extending notches 44. A plurality of spring action parts 45 are defined by combinations of these notches 43 and 44.

Noting the lower surface of the stator 2, concave portions 9 and 10 are provided similarly to the embodiment shown in FIGS. 1A to 1D, but no ribs are provided along edge portions of the lower surface.

Figure 14:
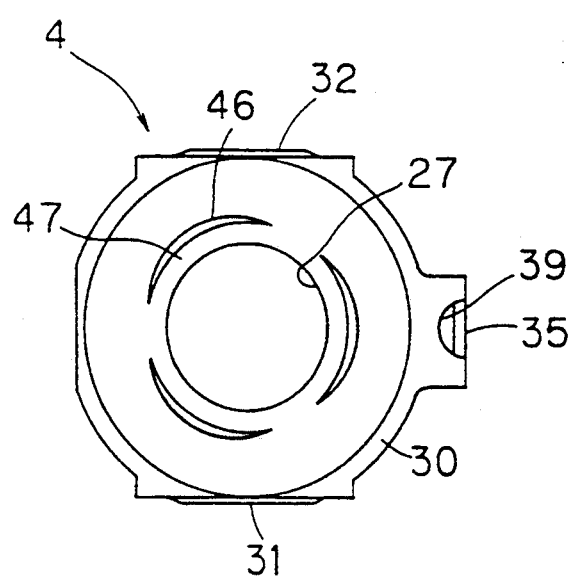
FIG. 14 is a plan view showing a cover 4 included in a sixth embodiment of the present invention.

FIG. 14 shows a further modification of the cover 4. A peripheral edge portion of an adjusting hole 27 formed in this cover 4 is provided with circumferentially extending notches 46 of prescribed lengths. Portions parted by such notches 46 are slightly downwardly bent to define spring action parts 47 in these portions.

A variable capacitor 1c shown in FIGS. 15A to 15D includes elements which are included in any of the aforementioned embodiments, with no additional feature in particular. Therefore, corresponding elements are denoted by similar reference numerals, to apply the aforementioned description.

Figure 15A:
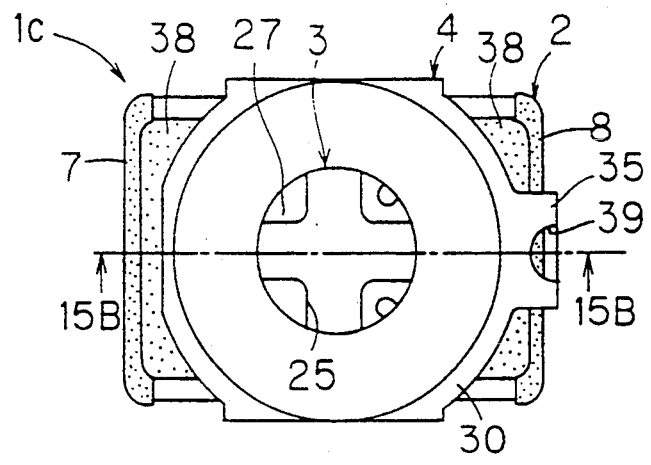
FIG. 15A is a plan view showing a variable capacitor 1c according to a seventh embodiment of the present invention.
Figure 15D:
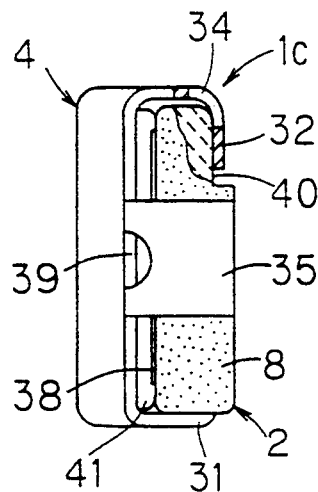
FIG. 15D is a partially fragmented right side elevational view of the variable capacitor 1c shown in FIG. 15A.
Figure 15B:
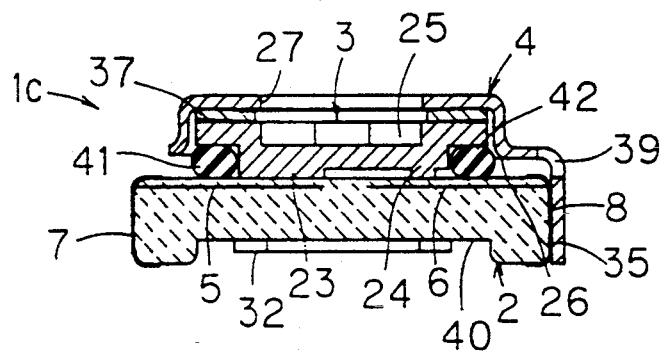
FIG. 15B is a sectional view taken along the line 15B—15B in FIG. 15A.
Figure 15C:
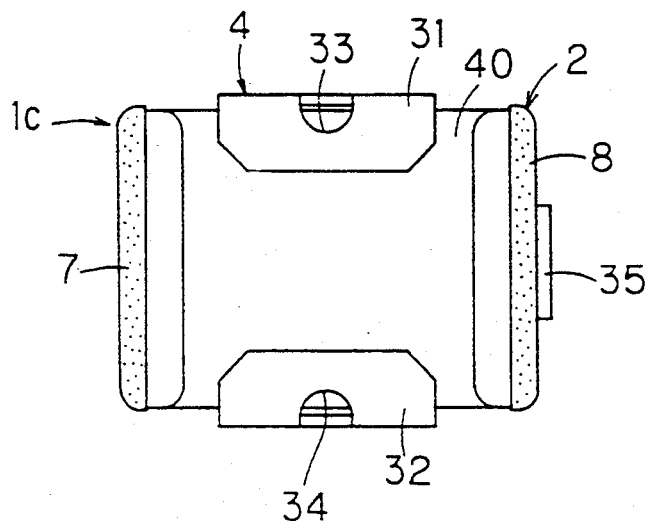
FIG. 15C is a bottom plan view of the variable capacitor 1c shown in FIG. 15A.
Figure 16:
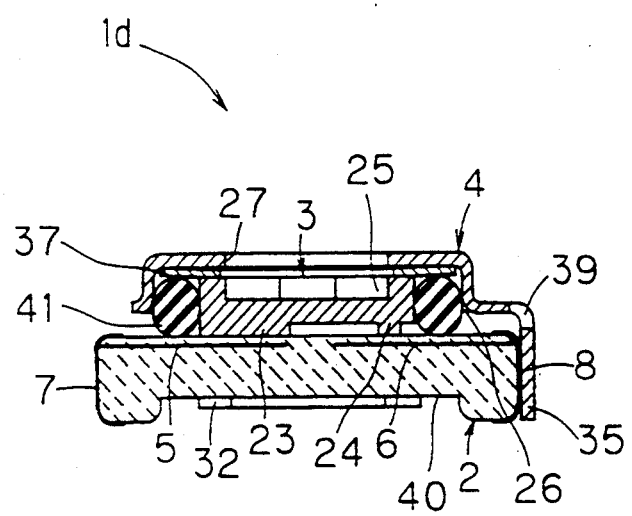
FIG. 16 is a sectional view showing a variable capacitor 1d according to an eighth embodiment of the present invention.

A variable capacitor 1d shown in FIG. 16 is similar to the variable capacitor 1c shown in FIGS. 15A to 15D, except the shape of a rotor 3 and a state of arrangement of an O-ring 41. No element corresponding to a concave portion 42 shown in FIG. 15B is formed in an outer peripheral portion of a rotor 3, which is provided in a simpler form. The O-ring 41 is arranged to enclose such a rotor 3 and comes into contact with a stator 2 and a spring washer 37, to supply a closed structure. According to this embodiment, it is possible to improve productivity of the rotor 3, which is simpler in shape than that shown in FIG. 15B. Referring to FIG. 16, elements corresponding to those shown in FIG. 15B are denoted by similar reference numerals, to omit redundant description.

Figure 17A:
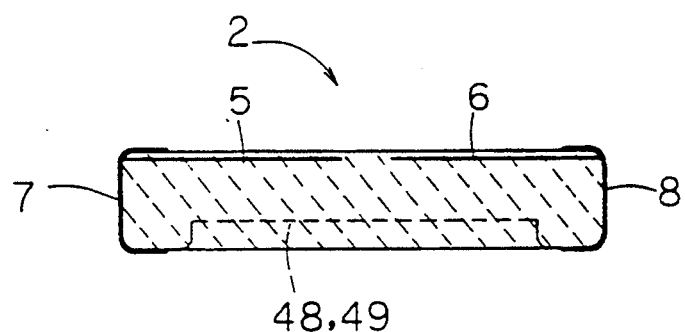
FIG. 17A is a sectional view showing a stator 2 included in a ninth embodiment of the present invention.
Figure 17B:
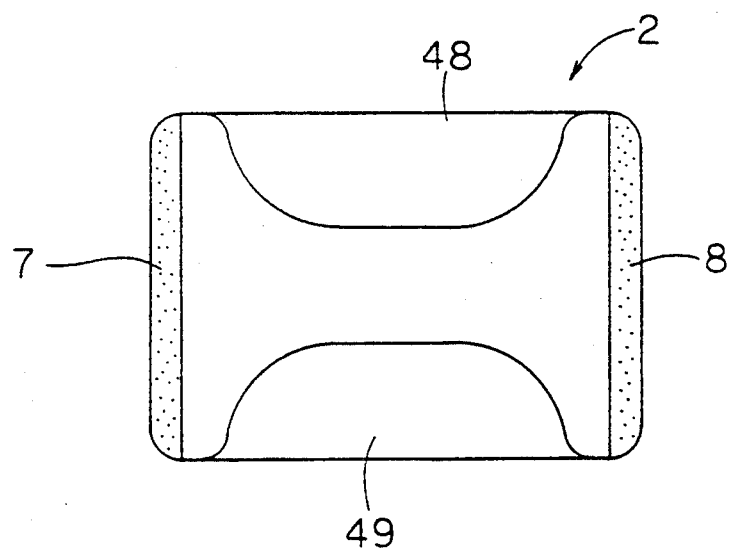
FIG. 17B is a bottom plan view of the stator 2 shown in FIG. 17A.

FIGS. 17A and 17B shows a further modification of the stator 2. Noting the lower surface of this stator 2, illustrated are two concave portions 48 and 49 which are formed in substantially semi-elliptic contours. Consideration is made on these concave portions 48 and 49, which are in dimensions sufficient for receiving the engaging members 31 and 32 of the cover 4 shown in FIG. 1, for example, so that these portions are maximized in strength and facilitated in front-rear arrangement.

Figure 18:
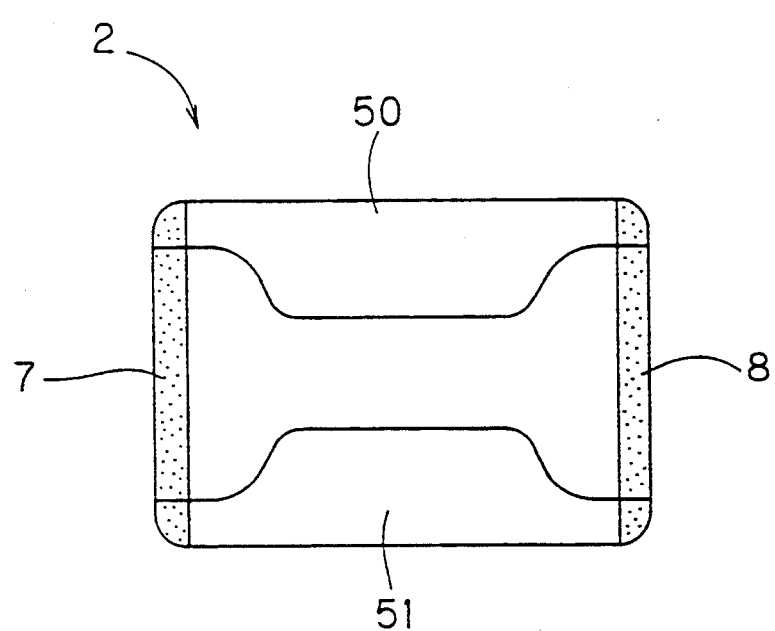
FIG. 18 is a bottom plan view showing a stator 2 included in a tenth embodiment of the present invention.
Figure 19:
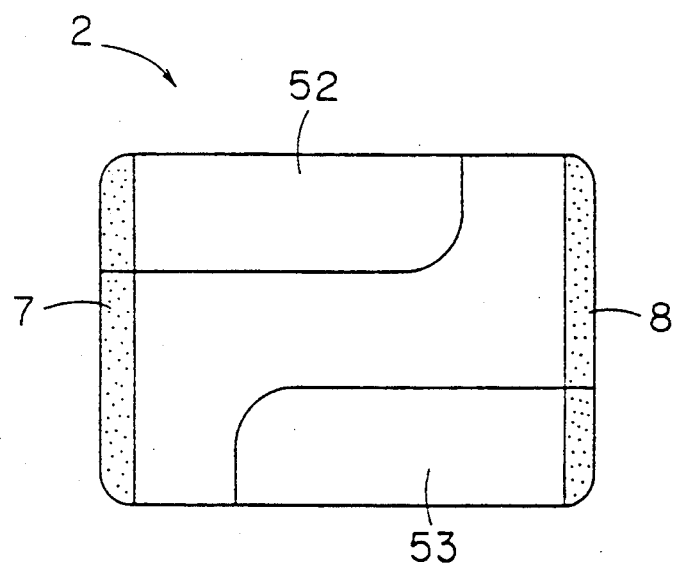
FIG. 19 is a bottom plan view showing a stator 2 included in an eleventh embodiment of the present invention.
Figure 20:
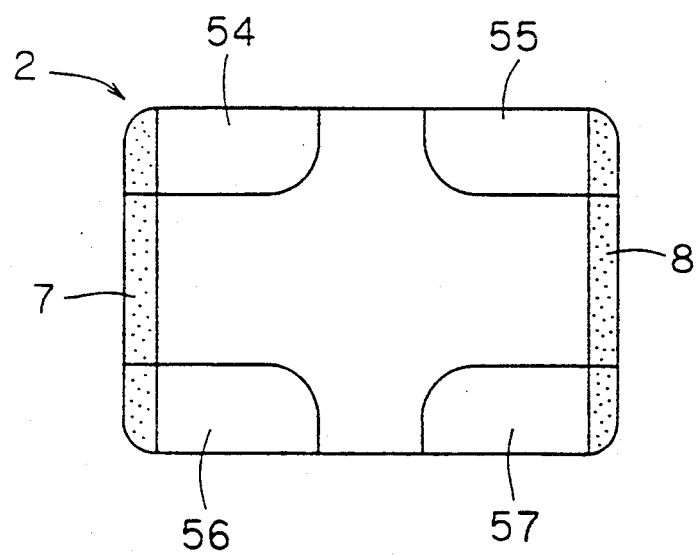
FIG. 20 is a bottom plan view showing a stator 2 included in a twelfth embodiment of the present invention.

FIGS. 18 to 20 show further modifications of the stator 2 respectively. Noting the lower surfaces of these stators 2, that shown in FIG. 18 is provided with two concave portions 50 and 51 and that shown in FIG. 19 is provided with two concave portions 52 and 53, while that shown in FIG. 20 is provided with four concave portions 54, 55, 56 and 57 respectively. These modifications prove that various modifications are available in relation to the shapes of the concave portions provided in the lower surface of the stator 2. The shapes and positions of the engaging portions provided on the cover 4 may be varied with those of the concave portions.

While the present invention has been described in relation to various embodiments which are directed to variable capacitors, further modifications are available within the scope of the present invention. For example, some of the features of the aforementioned embodiments may be combined to provide a further embodiment.

The present invention is not restricted to the aforementioned method of manufacturing a variable capacitor, but is widely applicable to a method of manufacturing an electronic component using a ceramic laminate which is provided with a concave portion. Description is now made on some embodiments applying the present invention to methods of manufacturing electronic components other than the variable capacitor.

Figure 21A:
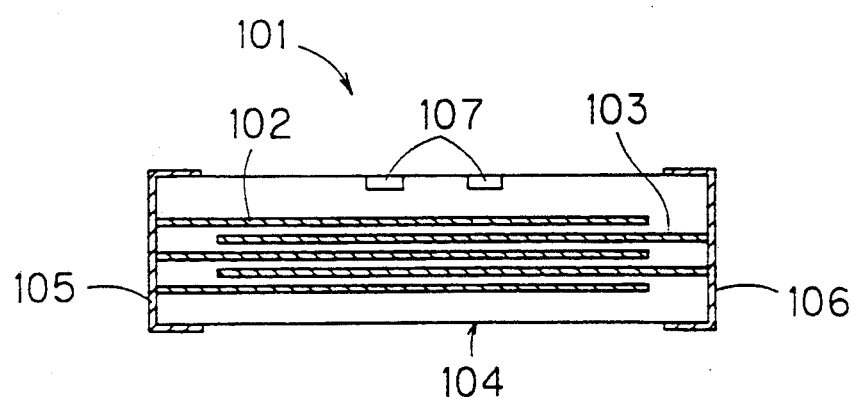
FIG. 21A is a sectional view, taken along the line 21A—21A in FIG. 21B, showing a multilayer ceramic capacitor 101 according to a thirteenth embodiment of the present invention.
Figure 21B:
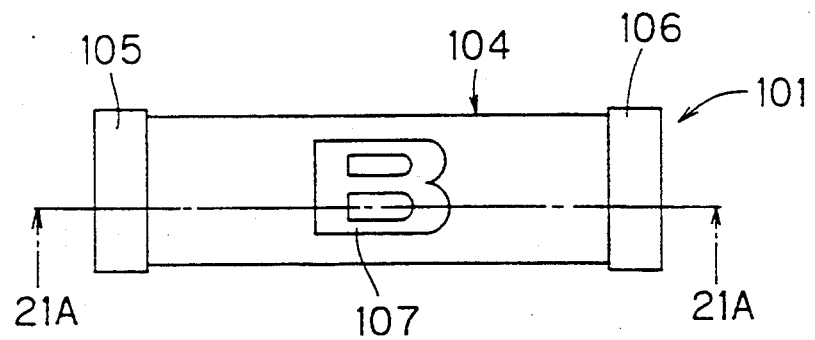
FIG. 21B is a plan view of the multilayer ceramic capacitor 101 shown in FIG. 21A.

FIGS. 21A and 21B show a multilayer ceramic capacitor 101. This multilayer ceramic capacitor 101 comprises a ceramic laminate 104 provided with plural internal electrodes 102 and 103 in its interior, and external electrodes 105 and 106 which are formed on outer surfaces of end portions of the ceramic laminate 104 to be electrically connected with the internal electrodes 102 or 103.

A character, figure or the like, for example, may be displayed on a surface of the ceramic laminate 104, in order to indicate desired information such as the electric capacitance of the multilayer ceramic capacitor 101. This display is provided by a concave portion 107 which is formed in the surface of the ceramic laminate 104. According to this embodiment, the concave portion 107 displays a character "B".

Figure 22A:
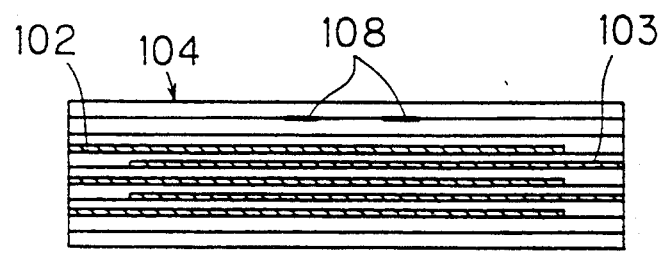
FIGS. 22A and 22B are sectional views successively showing typical steps included in a method of manufacturing the multilayer ceramic capacitor 101 shown in FIG. 21A.
Figure 22B:
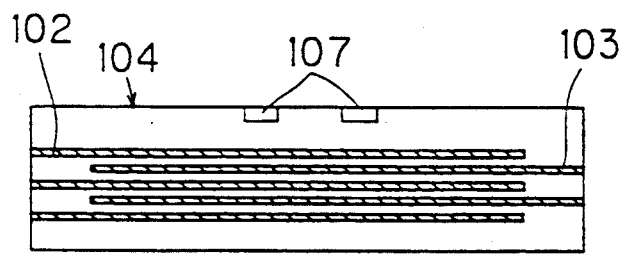

According to the present invention, it is possible to efficiently manufacture the multilayer ceramic capacitor 101 provided with the concave portion 107 supplying the aforementioned display with no requirement for a complicated operation. FIGS. 22A and 22B show typical steps for manufacturing the multilayer ceramic capacitor 101.

As shown in FIG. 22A, the ceramic laminate 104 is provided with burnaway films 108, in addition to the internal electrodes 102 and 103. These burnaway films 108 are burned away when the ceramic laminate 104 is fired, to define cavities and thin layers. Then, the as-obtained sintered body of the ceramic laminate 104 is subjected to a polishing step such as barrel polishing, for example, and then blasted. Thus, the thin layers are crushed to define the concave portion 104, as shown in FIG. 22B. When the external electrodes 105 and 106 are formed on the ceramic laminate 104 as shown in FIGS. 21A and 21B, the desired multilayer ceramic capacitor 101 is obtained.

The aforementioned character "B" can be easily formed on both surfaces of the ceramic laminate 104 by a similar step (not shown), as a matter of course.

Figure 23:
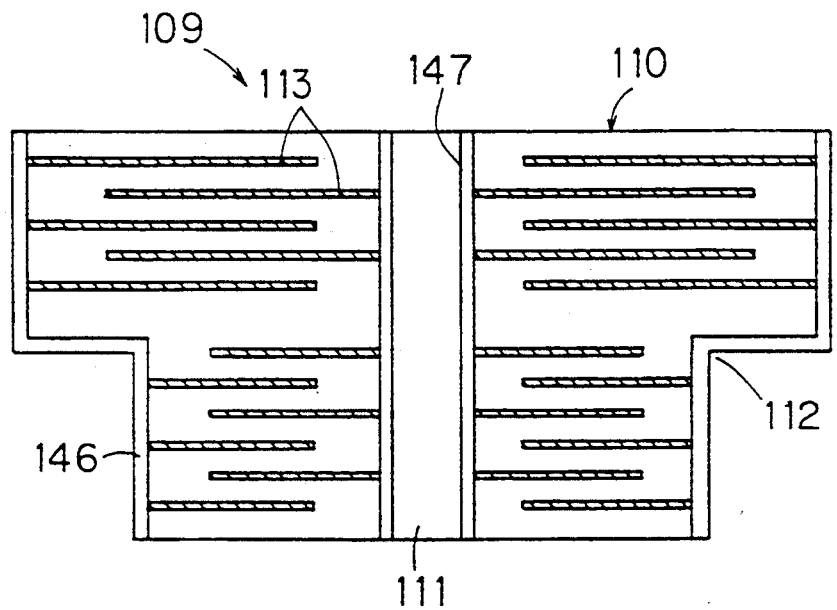
FIG. 23 is a sectional view showing a feed-through capacitor 109 according to a fourteenth embodiment of the present invention.

FIG. 23 shows a feed-through capacitor 109. This feed-through capacitor 109 comprises a cylindrical ceramic laminate 110, which is provided with a through hole 111 for receiving a through terminal (not shown) in its central portion and a concave portion 112 supplying a step portion for engaging with an earth plate included in a connector or the like, for example, on its outer peripheral surface. Further, internal electrodes 113 are formed in the interior of the ceramic laminate 110, while external electrodes 146 and 147 are formed on the outer peripheral surface of the ceramic laminate 110 and the inner peripheral surface of the through hole 111 respectively.

Figure 24:
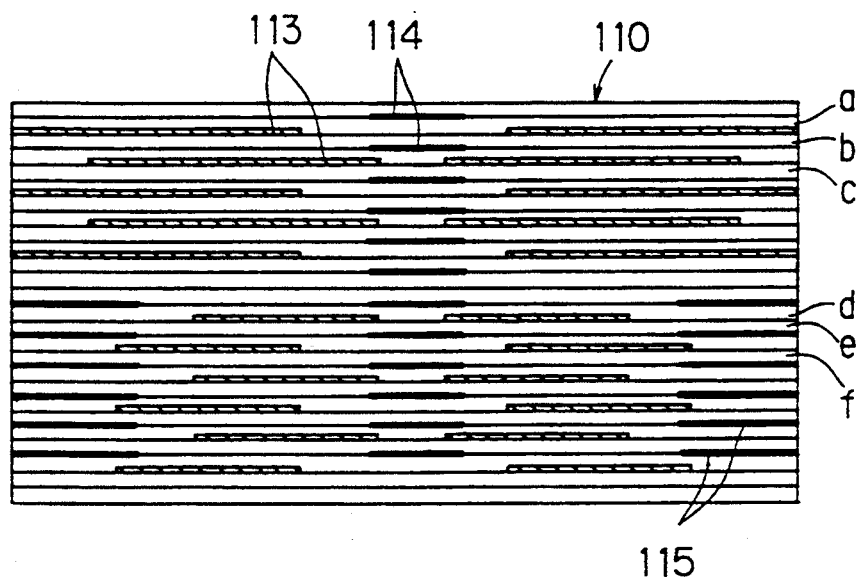
FIG. 24 is a sectional view for illustrating a method of obtaining a ceramic laminate 110 shown in FIG. 23.
Figure 25A:
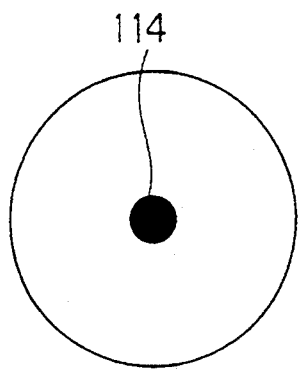
FIGS. 25A, 25B, 25C, 25D, 25E and 25F are top plan views of ceramic dielectric sheets a, b, c, d, e and f included in the ceramic laminate 110 shown in FIG. 24 respectively.
Figure 25D:
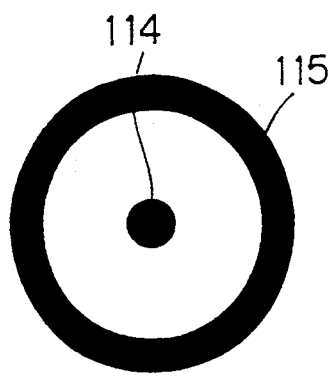
Figure 25B:
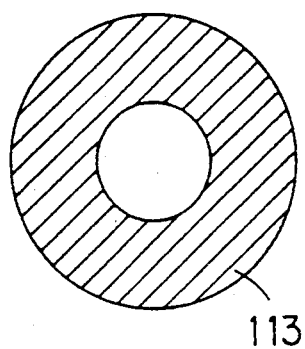
Figure 25E:
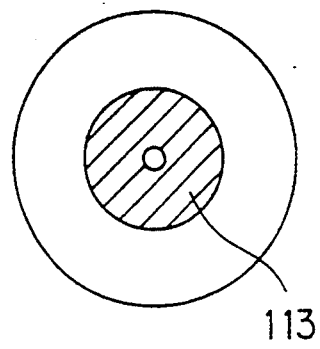
Figure 25C:
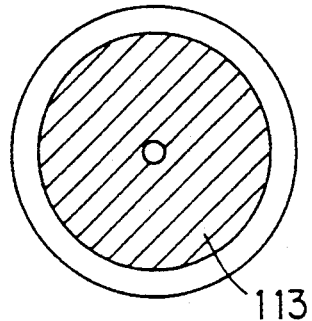
Figure 25F:
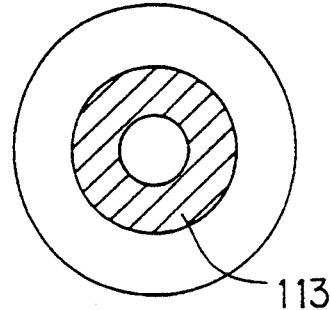

According to the present invention, neither specific step nor a specific die or equipment is required in order to form the through hole 111 and the concave portion 112 provided in the aforementioned feed-through capacitor 109. FIG. 24 is a sectional view showing an unfired state of the aforementioned ceramic laminate 110. On the other hand, FIGS. 25A to 25F show the upper surfaces of ceramic dielectric sheets a to f included in the ceramic laminate 110 respectively.

As shown in FIGS. 24 and 25A to 25F, burnaway films 114 and 115 are formed on specific ones of the ceramic dielectric sheets, to define the through hole 111 and the concave portion 112. As shown in FIGS. 24 and 25B, 25C and 25E, further, internal electrodes 113 are formed on other specific ones of the ceramic dielectric sheets. These ceramic dielectric sheets are stacked with each other, rigid-pressed and then fired. In the interior of the as-formed sintered body of the ceramic laminate 110, the internal electrodes 113 remain but the burnaway films 114 and 115 are burned away by the firing, thereby defining a plurality of cavities and a plurality of thin layers formed through such cavities. The sintered body of the ceramic laminate 110 is then subjected to a crushing step including barrel polishing and blasting, whereby the thin layers are crushed to define the through hole 111 and the concave portion 112. When the external electrodes 146 and 147 are formed on the ceramic laminate 110 obtained in the aforementioned manner, the desired feed-through capacitor shown in FIG. 23 is obtained.

Figure 26:
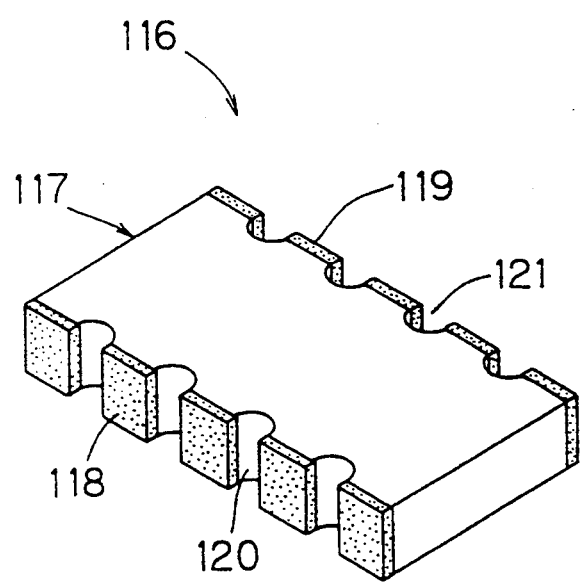
FIG. 26 is a perspective view showing a capacitor network 116 according to a fifteenth embodiment of the present invention.

FIG. 26 shows a capacitor network 116. This capacitor network 116 comprises a ceramic laminate 117, which is formed by a plurality of ceramic dielectric sheets being stacked with each other. A pair of opposite side surfaces of the ceramic laminate 117 are provided with plural terminal electrodes 118 and 119 respectively, while concave portions 120 and 121 are formed between respective pairs of the terminal electrodes 118 and 119 respectively. These concave portions 120 and 121 separate adjacent ones of the terminal electrodes 118 and 119 from each other, thereby preventing the terminal electrodes 118 and 119 from shorting and enabling application of efficient dipping etc. in formation of the terminal electrodes 118 and 119. The capacitor network 116 is provided with a plurality of multilayer capacitors, each of which has terminals defined by an opposite pair of terminal electrodes 118 and 119.

Figure 27A:
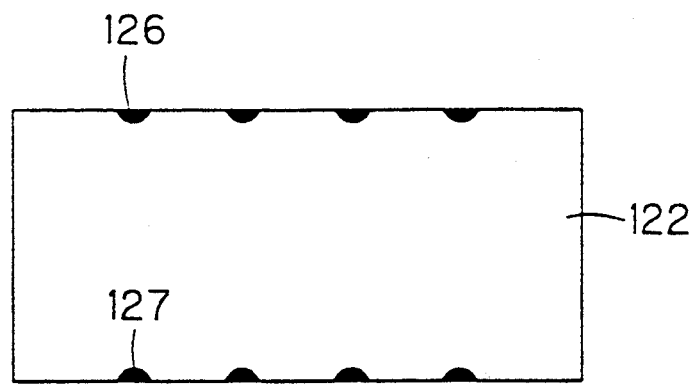
FIGS. 27A, 27B, 27C and 27D are top plan views showing ceramic dielectric sheets 122, 123, 124 and 125 prepared for obtaining a ceramic laminate 117 shown in FIG. 26 respectively.
Figure 27B:
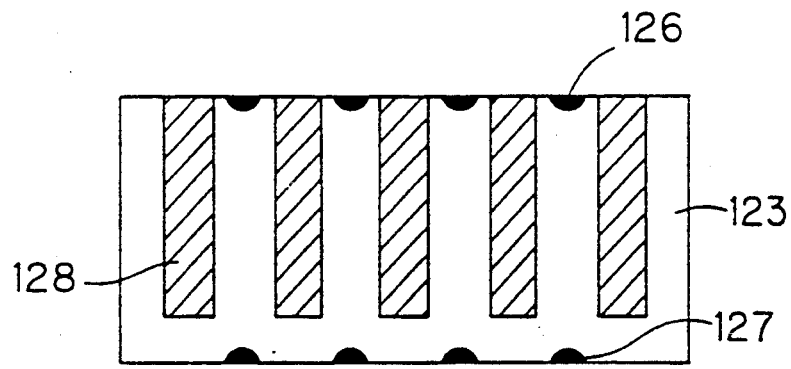
Figure 27C:
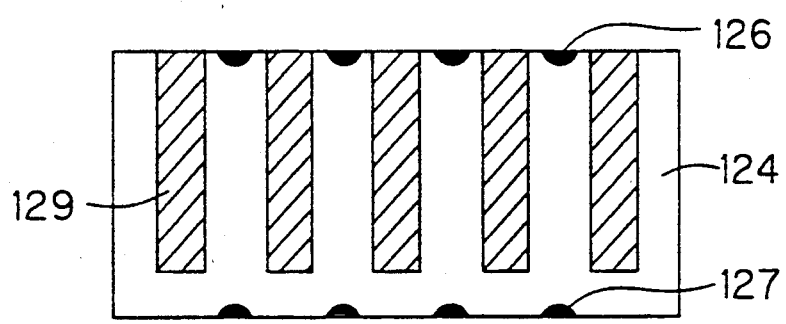
Figure 27D:
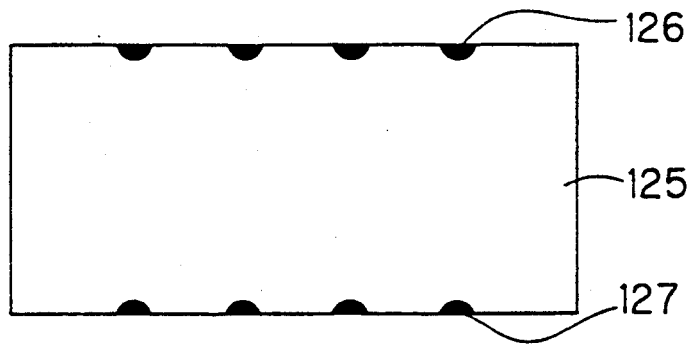

According to the present invention, it is possible to easily form the concave portions 120 and 121 in the ceramic laminate 117 provided in the aforementioned capacitor network 116. FIGS. 27A to 27D show the upper surfaces of ceramic dielectric sheets 122, 123, 124 and 125 which are prepared for obtaining the ceramic laminate 117 respectively. The ceramic dielectric sheet 122 shown in FIG. 27A is located on the uppermost stage of the ceramic laminate 117 and the ceramic dielectric sheet 125 shown in FIG. 27D is located on the lowermost stage of the ceramic laminate 117, while the ceramic dielectric sheets 123 and 124 respectively shown in FIGS. 27B and 27C, which are located between the ceramic dielectric sheets 122 and 125, are alternately stacked by prescribed numbers.

The ceramic dielectric sheets 122 to 125 are provided with burnaway films 126 and 127 for defining the aforementioned concave portions 120 and 121 respectively. Further, the ceramic dielectric sheets 123 and 124 are provided with capacitor electrodes 128 and 129 respectively. Respective ones of these capacitor electrodes 128 and 129 are electrically connected to the terminal electrodes 118 and 119 shown in FIG. 26.

The ceramic dielectric sheets 122 to 125 shown in FIGS. 27A to 27D are stacked with each other, rigid-pressed and then fired. In the as-formed sintered body of the ceramic laminate 117, the capacitor electrodes 128 and 129 remain but the burnaway films 126 and 127 are burned away thereby defining a plurality of cavities and a plurality of thin layers formed through the cavities. The sintered body of the ceramic laminate 117 is subjected to a crushing step including barrel polishing and blasting so that the thin layers are crushed, whereby the concave portions 120 and 121 are formed on the side surfaces of the ceramic laminate 117. Then, the respective side surfaces of the ceramic laminate 117 are dipped in an electrode coating material such as silver paste, for example, up to intermediate portions of the concave portions 120 and 121 and then drawn out so that the electrode coating material applied thereto is baked, thereby forming the terminal electrodes 118 and 119. Thus, the capacitor network 116 shown in FIG. 26 is obtained.

Figure 28A:
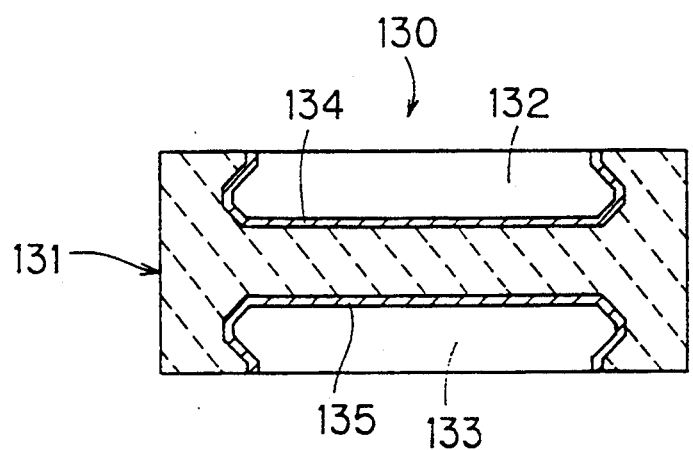
FIG. 28A is a sectional view showing a high-voltage capacitor 130 according to a sixteenth embodiment of the present invention.
Figure 28B:
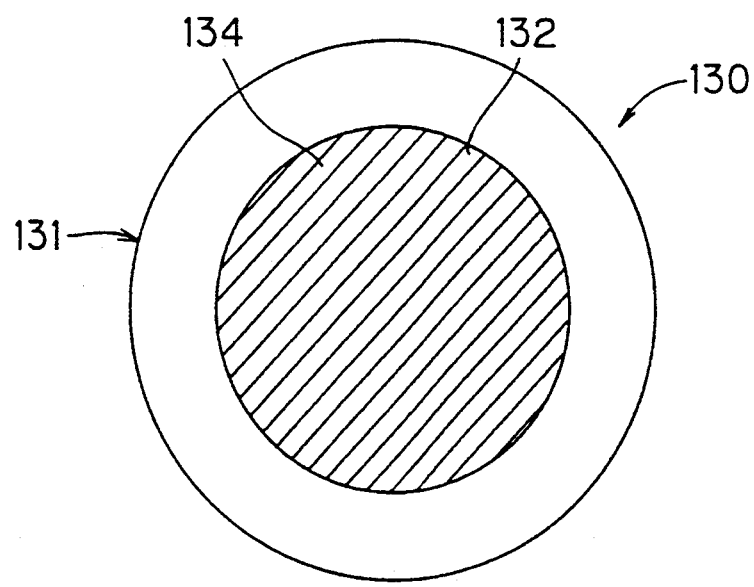
FIG. 28B is a plan view of the high-voltage capacitor 130 shown in FIG. 28A.

FIGS. 28A and 28B show a ceramic capacitor having a high withstand voltage, i.e., a high-voltage capacitor 130. This high-voltage capacitor 130 comprises a cylindrical ceramic laminate 131 serving as a dielectric, and concave portions 132 and 133 which are formed in opposite major surfaces thereof. The concave portions 132 and 133 are defined by inner surfaces having loosely curved three-dimensional shapes. Electrodes 134 and 135 are formed on such inner surfaces of the concave portions 132 and 133 respectively. Thus, the electrodes 134 and 135 have three-dimensional structures called Rogowskii electrodes, so that a creeping distance from a peripheral edge of one electrode 134 or 135 to that of the other electrode 135 or 134 along the outer peripheral surface of the ceramic laminate 131 is increased and electrical field concentration is suppressed in regions close to the peripheral edges of the electrodes 134 and 135 respectively, thereby increasing the withstand voltage.

Figure 29A:
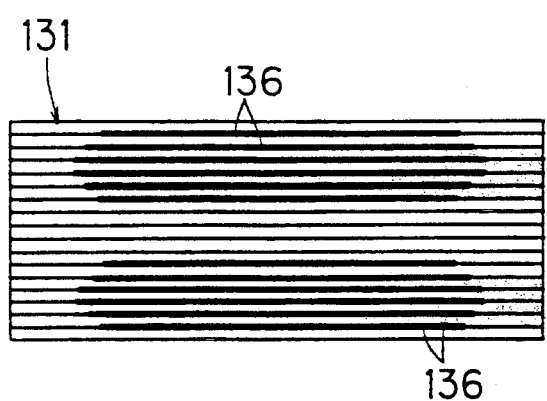
FIGS. 29A and 29B are sectional views successively showing typical steps included in a method of obtaining the ceramic laminate 131 shown in FIG. 28A.
Figure 29B:
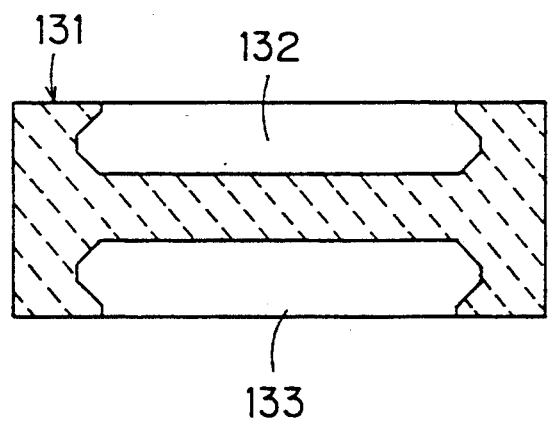

According to the present invention, it is possible to easily manufacture the aforementioned high-voltage capacitor 130. FIGS. 29A and 29B show typical steps included in a method of obtaining the aforementioned high-voltage capacitor 130.

As shown in FIG. 29A, the ceramic laminate 131 is provided with burnaway films 136 in portions for defining the concave portions 132 and 133. Such a ceramic laminate 131 is then fired. Thus, the burnaway films 136 are burned away so that a plurality of cavities are defined and a plurality of thin layers are formed through such cavities in the interior of the ceramic laminate 131. Then, the as-formed sintered body of the ceramic laminate 131 is subjected to a crushing step including barrel polishing and blasting, for example, whereby the thin layers are crushed to form the concave portions 132 and 133 of three-dimensional shapes as shown in FIG. 29B. When the electrodes 134 and 135 are provided on the inner surfaces of the concave portions 132 and 133, the high-voltage capacitor 130 shown in FIGS. 28A and 28B is obtained.

Figure 30A:
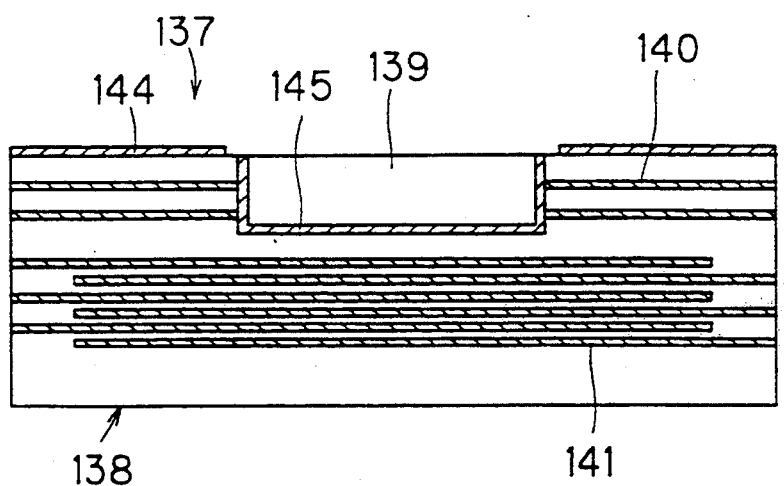
FIG. 30A is a sectional view showing a semiconductor package 137 according to a seventeenth embodiment of the present invention.
Figure 30B:
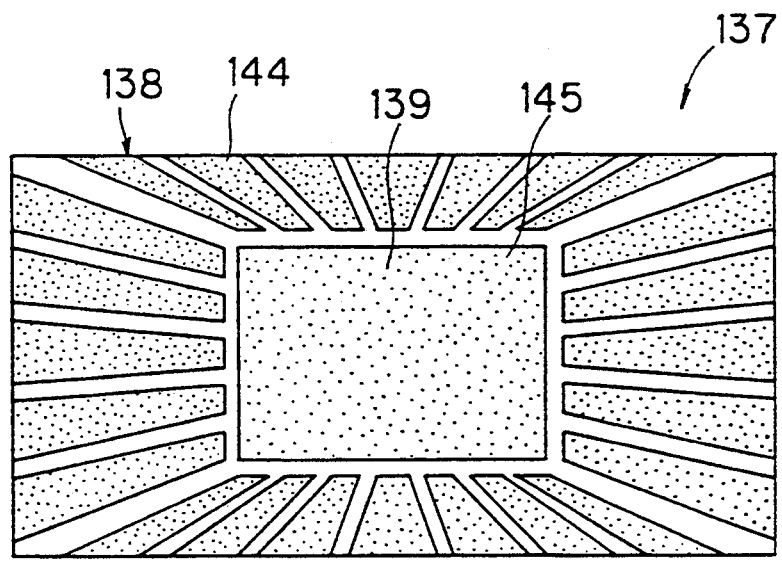
FIG. 30B is a plan view of the semiconductor package 137 shown in FIG. 30A.

FIGS. 30A and 30B show a semiconductor package 137. This semiconductor package 137 comprises a ceramic laminate 138 which can provide a reliable sealed structure, while this ceramic laminate 138 is provided with a concave portion 139 on which a semiconductor integrated circuit (IC) (not shown) is mounted. A ground electrode 140 and a capacitor electrode 141 are formed in the interior of the ceramic laminate 138. A capacitor provided by the capacitor electrode 141 is adapted to prevent another semiconductor integrated circuit from a malfunction caused by a noise generated from this semiconductor integrated circuit.

Figure 31:
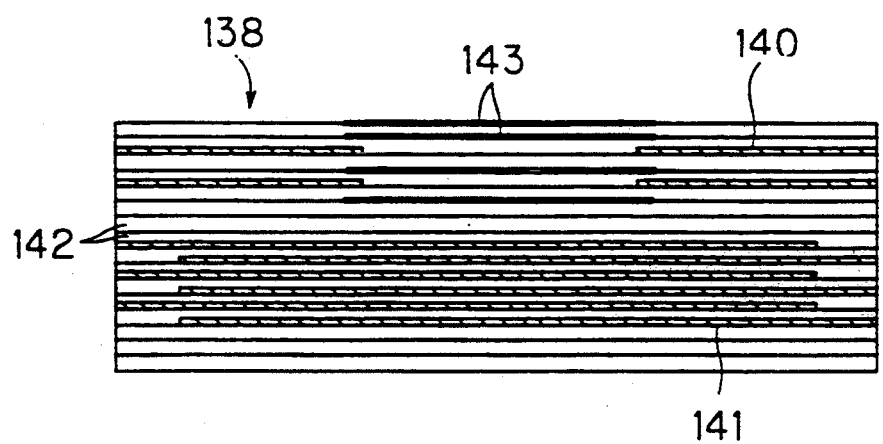
FIG. 31 is a sectional view for illustrating a method of obtaining the ceramic laminate 138 shown in FIG. 30A.

According to the present invention, it is possible to easily manufacture the aforementioned semiconductor package 137. FIG. 31 shows a step which is included in a method of obtaining the ceramic laminate 138.

As shown in FIG. 31, the ground electrode 140 and the capacitor electrode 141 are formed on specific ones of ceramic dielectric sheets 142 included in the ceramic laminate 138 respectively. Further, burnaway films 143 are formed on specific ceramic dielectric sheets 142 in portions for defining the concave portion 139. The ceramic dielectric sheets 142 are stacked with each other and then rigid-pressed, so that the as-obtained ceramic laminate 138 is then fired. Thus, the burnaway films 143 are burned away to define cavities and thin layers in the as-formed sintered body of the ceramic laminate 138. Then, the sintered body of the ceramic laminate 138 is subjected to a crushing step including barrel polishing and blasting, for example, whereby the thin layers are crushed to define the concave portion 139. Then a pad electrode 144 and a bonding electrode 145 are formed to obtain the semiconductor package 137 as shown in FIGS. 30A and 30B.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing an electronic component provided with a concave portion, said method comprising the steps of:
   preparing a laminate comprising a plurality of ceramic sheets, specific ones of said ceramic sheets having burnaway film formed thereon, said burnaway film being made of a material capable of being burned away by firing, said burnaway films being provided in positions corresponding to a position of said concave portion;
   firing said laminate to burn out said burnaway films, thereby obtaining a sintered body being formed with a plurality of cavities and a plurality of thin layers being formed between said plurality of cavities; and
   crushing said thin layers of said sintered body, thereby forming said concave portion.

2. A method of manufacturing an electronic component in accordance with claim 1, wherein said burnaway films contain carbon.

3. A method of manufacturing an electronic component in accordance with claim 1, wherein said burnaway films contain resin.

4. A method of manufacturing an electronic component in accordance with claim 1, wherein said crushing step includes at least one of barrel polishing, blasting, application of a water jet and application of ultrasonic waves.

* * * * *

UNITED STATES PATENT AND TRADEMARK OFFICE
CERTIFICATE OF CORRECTION

PATENT NO. : 5,423,930
DATED : June 13, 1995
INVENTOR(S) : Hiroyuki Kishishita, Yukio Hatanaka It is certified that error appears in the above-indentified patent and that said Letters Patent is hereby corrected as shown below:

On the cover page item [75] (Inventors), "Yukinori Ueda," is deleted.

Signed and Sealed this

Thirteenth Day of February, 1996

Attest:

BRUCE LEHMAN

*Attesting Officer*      *Commissioner of Patents and Trademarks*